(12) United States Patent
Zhu et al.

(10) Patent No.: US 7,667,230 B2
(45) Date of Patent: *Feb. 23, 2010

(54) ELECTRONIC DEVICES CONTAINING ACENE-THIOPHENE COPOLYMERS

(75) Inventors: Peiwang Zhu, Woodbury, MN (US); Tzu-Chen Lee, Woodbury, MN (US); Dennis E. Vogel, Lake Elmo, MN (US); Christopher P. Gerlach, Petaluma, CA (US)

(73) Assignee: 3M Innovative Properties Company, St. Paul, MN (US)

( * ) Notice: Subject to any disclaimer, the term of this patent is extended or adjusted under 35 U.S.C. 154(b) by 747 days.

This patent is subject to a terminal disclaimer.

(21) Appl. No.: 11/278,229

(22) Filed: Mar. 31, 2006

(65) Prior Publication Data

US 2007/0228360 A1    Oct. 4, 2007

(51) Int. Cl.
  *H01L 35/24*    (2006.01)
(52) U.S. Cl. .................... 257/40; 313/504; 438/99
(58) Field of Classification Search ............... 528/310; 257/40
  See application file for complete search history.

(56) References Cited

U.S. PATENT DOCUMENTS

| | | |
|---|---|---|
| 3,242,218 A | 3/1966 | Miller |
| 3,250,808 A | 5/1966 | Moore, Jr. et al. |
| 3,274,239 A | 9/1966 | Selman |
| 3,293,306 A | 12/1966 | Le Bleu et al. |
| 3,322,826 A | 5/1967 | Moore |
| 3,536,710 A | 10/1970 | Bartlett |
| 3,544,537 A | 12/1970 | Brace |
| 3,553,179 A | 1/1971 | Bartlett |
| 3,810,874 A | 5/1974 | Mitsch et al. |
| 3,864,318 A | 2/1975 | Caporiccio et al. |
| 4,321,404 A | 3/1982 | Williams et al. |
| 4,472,480 A | 9/1984 | Olson |
| 4,567,073 A | 1/1986 | Larson et al. |
| 4,647,413 A | 3/1987 | Savu |
| 4,818,801 A | 4/1989 | Rice et al. |
| 4,830,910 A | 5/1989 | Larson |
| 5,306,758 A | 4/1994 | Pellerite |
| 5,347,144 A | 9/1994 | Garnier et al. |
| 5,362,919 A | 11/1994 | Costello et al. |
| 5,454,880 A | 10/1995 | Saricifti et al. |
| 5,523,555 A | 6/1996 | Friend et al. |
| 5,578,278 A | 11/1996 | Fall et al. |

(Continued)

FOREIGN PATENT DOCUMENTS

JP    02-218716    8/1990

(Continued)

OTHER PUBLICATIONS

Kotera et al. (Synthetic Metals, 119, 73-74, 2001).*

(Continued)

*Primary Examiner*—Randy Gulakowski
*Assistant Examiner*—Shane Fang
(74) *Attorney, Agent, or Firm*—Jean A. Lown

(57) ABSTRACT

Electronic devices that include an acene-thiophene copolymer and methods of making such electronic devices are described. The acene-thiophene copolymer can be used, for example, in a semiconductor layer or in a layer positioned between a first electrode and a second electrode.

29 Claims, 4 Drawing Sheets

U.S. PATENT DOCUMENTS

| | | | |
|---|---|---|---|
| 6,127,498 | A | 10/2000 | Tonelli et al. |
| 6,291,621 | B1 | 9/2001 | Tan et al. |
| 6,355,365 | B1 | 3/2002 | Hotta et al. |
| 6,359,149 | B1 | 3/2002 | Tan et al. |
| 6,433,359 | B1 | 8/2002 | Kelley et al. |
| 6,585,914 | B2 | 7/2003 | Marks et al. |
| 6,602,395 | B1 | 8/2003 | Zhuang et al. |
| 6,608,323 | B2 | 8/2003 | Marks et al. |
| 6,617,609 | B2 | 9/2003 | Kelley et al. |
| 6,690,029 | B1 | 2/2004 | Anthony et al. |
| 6,821,348 | B2 | 11/2004 | Baude et al. |
| 6,828,582 | B1 | 12/2004 | Ando et al. |
| 6,864,396 | B2 | 3/2005 | Smith et al. |
| 6,872,801 | B2 | 3/2005 | Ong et al. |
| 6,897,164 | B2 | 5/2005 | Baude et al. |
| 6,906,534 | B2 | 6/2005 | Hoisington et al. |
| 6,946,597 | B2 | 9/2005 | Sager et al. |
| 6,974,877 | B2 | 12/2005 | Vogel et al. |
| 6,998,068 | B2 | 2/2006 | Gerlach |
| 7,002,176 | B2 | 2/2006 | Iechi et al. |
| 7,030,409 | B2 | 4/2006 | Lee et al. |
| 7,049,629 | B2 | 5/2006 | Wu et al. |
| 2003/0102471 | A1 | 6/2003 | Kelley et al. |
| 2003/0151118 | A1 | 8/2003 | Baude et al. |
| 2003/0227001 | A1* | 12/2003 | Li et al. ................ 252/301.35 |
| 2004/0067387 | A1 | 4/2004 | Kim et al. |
| 2004/0104386 | A1 | 6/2004 | Wu et al. |
| 2004/0119049 | A1* | 6/2004 | Heeney et al. ........... 252/299.3 |
| 2004/0222412 | A1 | 11/2004 | Bai et al. |
| 2005/0033263 | A1 | 2/2005 | Gottlieb et al. |
| 2005/0035333 | A1 | 2/2005 | Gerlach |
| 2005/0093031 | A1 | 5/2005 | Akkerman et al. |
| 2006/0033086 | A1 | 2/2006 | Gerlach |
| 2006/0102890 | A1 | 5/2006 | Yamahara et al. |

FOREIGN PATENT DOCUMENTS

| | | |
|---|---|---|
| JP | 2001-151868 | 6/2001 |
| WO | WO 03/095445 A1 | 11/2003 |
| WO | WO 2005/055248 | 6/2005 |

OTHER PUBLICATIONS

Liu, Yunqi et al., "A Binaphthyl-Bithiophene Copolymer for Light-Emitting Devices", Macromolecular Chemistry and Physics (2002), 203, No. 1, pp. 37-40.

Anthóny et al., "Functionalized Pentacene: Improved Electronic Properties from Control of Solid-State Order", *Am. Chem. Soc.*, 2001, 123. pp. 9482-9483.

Brabec, Christopher J., "Organic Photovoltaics: Technology and Market", *Solar Energy Materials and Solar Cells*, 2004, vol. 83, pp. 273-292.

Chan et al., "A Soluable Pentacene: Synthesis, EPR and Electrochemical Studies of 2,3,9,10-Tetrakis(Trimethylsilyl)Pentacene", *Chem Commun.*, 2005, pp. 66-68.

Chen et al., "Regiocontrolled Synthesis of Poly(3-alkylthiophenes) Mediated by Rieke Zinc: Their Characterization and Solid-State Properties", *J. Am. Chem. Soc.*, 1995, 117, 233-244.

Clar et al., "The Nature of Para-Bond and of Para-Coupling", *Tetrahedron*, 28, 5049 (1972).

Comel, "Efficient One Pot Preparation of Variously Substituted Thieno[2,3-*b*]thiophene", *Journal of Heterocyclic Chemistry*, 2001, 38, pp. 116-1171.

Heeney et al., "Alkylidene Fluorene Liquid Crystalline Semiconducting Polymers for Organic Field Effect Transistor Devices", *Macromolecules*, 2004, 37, pp. 5250-5256.

Heeney, et al., "Stable Polythiophene Semiconductors Incorporating Thieno[2,3-b]thiophene", *J. Am. Chem. Soc.*, 2005, 127, pp. 1078-1079.

Hodge et al., "Synthesis of Poly(anthracene-2,6-diyl) and a Copolymer Containing Alternately Anthracene-2,6-diyl and *p*-phenylene Units", *Chem. Commun.*, 1997, pp. 73-74.

Ito et al., "Oligo(2,6-anthrylene)s: Acene-Oligomer Approach for Organic Field-Effect Transistors", *Angew. Chem., Int. Ed.*, 42, pp. 1159-1162 (2003).

Katz et al., "Synthetic Chemistry for Ultrapure, Processable, and High-Mobility Organic Transistor Semiconductors", *Acc. Chem. Res.*, vol. 34, pp. 359-369 (2001).

Laquindanum et al., "Synthesis, Morphology, and Field-Effect Mobility of Anthradithiophenes", *J. Am. Chem. Soc.*, 1998, vol. 120. pp. 664-672.

Loewe et al., "Regioregular, Head-to-Tail Coupled Poly(3-alkylthiophenes) Made Easy by the GRIM Method: Investigation of the Reaction and the Origin of Regioselectivity", *Macromolecules*, 2001, 34, pp. 4324-4333.

McCulloch et al., "Influence of Molecular Design on the Field-Effect Transistor Characteristics of Terthiophene Polymers", *Chem Mater.*, 2005, vol. 17, pp. 1381-1385.

McCullough et al., "Design, Synthesis, and Control of Conducting Polymer Architectures: Structurally Homogeneous Poly(3-alkylthiophenes)", *J. Org. Chem*, 1993, 58, pp. 904-912.

Meng et al., "High-Performance, Stable Organic Thin-Film Field-Effect Transistors Based on Bis-5'-alkylthiophen-2'-yl-2,6-anthracene Semiconductors", *J. Am. Chem. Soc.*, 2005, 127, pp. 2406-2407.

Miller et al., "Synthesis of β-Methoxy, Methyl-Capped α-Oligothiophenes", *J. Org. Chem.*, 60, pp. 6813-6819 (1995).

Musick et al., "Synthesis of Binaphthyl-Oligothiophene Copolymers With Emissions of Different Colors: Systematically Tuning the Photoluminescence of Conjugated Polymers", *Macromolecules*, 1998, vol. 31, pp. 2933-2942.

Nielson et al., "Structure-Property Relations of Regiosymmetrical 3,4-Dioxy-Functionalized Polythiophenes", *Macromolecules*, 2005, 38, 10379-10387.

Portnoy, J., "Fluorinated Acylthiophenes. Preparation of 5,5'-Diheptafluorobutyryl-2,2'-bithiophene via a Grignard Coupling Reaction", *Org. Chem.*, 1967, vol. 32, pp. 233-234.

Rajca et al., "Synthesis and Structure of Tetrathiophene With A Chiral 1,1'-binaphthyl Kink", *Chem. Commun*, 2001, pp. 1060-1061.

Ried et al., *Angewante Chemie*, 1953, vol. 65, pp. 601.

Ruiz et al., "Repeat Unit Symmetry Effects on the Physical and Electronic Properties of Processable, Electrically Conducting, Substituted Poly (1,4-bis(2-thienyl)phenylenes)", *Macromolecules*, 1992, vol. 25, pp. 849-860.

Savu, Patricia M., "Fluoronated Higher Carboxylic Acids", *11 Kirk-Othmer Encyclopedia of Chemical Technology*, pp. 551-558, (4th Edition 1994).

Sheraw et al., "Spin-on Polymer Gate Dielectric for High Performance Organic Thin Film Transistors", *Materials Research Symposium Proceedings*, 2000, vol. 558, pp. 403-408.

Sirringhaus et al., "Mobility Enhancement in Conjugated Polymer Field-Effect Transistors Through Chain Alignment in a Liquid-Crystalline Phase", *Appl. Phys. Lett.*, 2000, vol. 77 No. 3, pp. 406-408.

Sirringhaus et al., "High-Resolution Inkjet Printing of All-Polymer Transistor Circuits", *Science*, 2000, vol. 290, pp. 2123-2126.

Sotzing et al., "Electrochromic Conducting Polymers via Electrochemical Polymerization of Bis(2-(3,4-ethylenedioxy)thienyl) Monomers", *Chem. Mater.*, 8, pp. 882-889 (1996).

Spanggaard et al., "A Brief History of the Development of Organic and Polymeric Photovoltaics", *Solar Energy Materials and Solar Cells*, 2004, vol. 83, pp. 125-146.

Stokes et al., "New Phosphonic Acid Functionalized, Regioregular Polythiophenes", *Macromolecules*, 2003, 36, pp. 7114-7118.

Veres et al., "Air Stable, Amorphous Organic Films and their Applications to Solution Processable Flexible Electronics", *Mater. Res. Soc. Symp. Proc.*, 2002, vol. 708.

Veres et al., "Low-κ Insulators as the Choice of Dielectrics in Organic Field-Effect Transistors", *Adv. Funct. Mater.*, 2003, 13, pp. 199-204.

Veres et al., "Gate Insulators in Organic Field-Effect Transistors", *Chem. Mater.*, 2004, 16, pp. 4543-4555.

Vidal et al., "η-Conjugated Ligand Polymers Entwined Around Copper Centres", *Chem. Eur. J.*, 2000, 6, pp. 1663-1673.

Wei et al., "Synthesis and Electronic Properties of Aldehyde End-Capped Thiophene Oligomers and Other α,ω-Substituted Sexithiophenes", *Chem. Mater.*, 1996, vol. 8, pp. 2659-2666.

Wurthner et al., "Synthesis and Energy Transfer Properties of Terminally Substituted Oligothiophenes", *J. Am. Chem. Soc.*, 1995, vol. 117, pp. 8090-8099.

Zhai et al., "A Simple Method to Generate Side-Chain Derivatives of Regioregular Polythiophene via the GRIM Metathesis and Post-polymerization Functionalization", *Macromolecules*, 2003, 36, pp. 61-64.

Zhang et al., "Alkyl-Substituted Thieno[3,2-*b*]thiophene and Their Dimeric Subunits", *Macromolecules*, 2004, 37, pp. 6306-6315.

Zhu et al., "Conducting Polymetallorotaxanes: Metal Ion Mediated Enhancements in Conductivity and Charge Localization", *J. Am. Chem Soc.*, 1997, vol. 119, pp. 12568-12577.

Zhu et al., "Phenoxazine-Based Conjugated Polymers: A New Class of Organic Semiconductors for Field-Effect Transistors", *Macromolecules*, 2005, vol. 38, pp. 7983-7991.

U.S. Application entitled "6,13-Bis(thienyl)pentacene Compounds", filed Jul. 29, 2005, having U.S. Appl. No. 11/192,950.

U.S. Application entitled "Perfluoroether Acyl Oligothiophene Compounds", filed Mar. 9, 2005, having U.S. Appl. No. 11/076,268.

U.S. Application entitled "Bottom Gate Thin Film Transistors", filed Dec. 28, 2005, having U.S. Appl. No. 11/275,367.

U.S. Application entitled "Acene-Thiophene Copolymers", filed Mar. 31, 2006, having U.S. Appl. No. 11/278,222.

U.S. Application entitled "Acene-Thiophene Copolymers With Silethynly Groups", filed Apr. 21, 2006, having U.S. Appl. No. 11/379,642.

U.S. Application entitled "Electrtonic Devices Containing Acene-Thiophene Copolymers With Silethynly Groups", filed Apr. 21, 2006, having U.S. Appl. No. 11/379,662.

* cited by examiner

ELECTRONIC DEVICES CONTAINING ACENE-THIOPHENE COPOLYMERS

TECHNICAL FIELD

Electronic devices and methods of making electronic devices that include an acene-thiophene copolymer are described.

BACKGROUND

Traditionally, inorganic materials have dominated the electronic device industry. For example, silicon arsenide and gallium arsenide have been used as semiconductor materials, silicon dioxide has been used as an insulator material, and metals such as aluminum and copper have been used as electrode materials. In recent years, however, there has been an increasing research effort aimed at using organic materials rather than the traditional inorganic materials in electronic devices. Among other benefits, the use of organic materials may enable lower cost manufacturing of electronic devices, may enable large area applications, and may enable the use of flexible circuit supports for display backplane and integrated circuits.

A variety of organic semiconductor materials have been considered, the most common being fused aromatic ring compounds as exemplified by small molecules such as pentacene-containing compounds, tetracene-containing compounds, anthracene-containing compounds, bis(acenyl)acetylene compounds, and acene-thiophene compounds. Several polymeric materials have also been considered such as regioregular polythiophenes such as poly(3-alkylthiophene) and polymers having fused thiophene units or bis-thiophene units. However, at least some of the polymers tend to undergo oxidation, which can lead to diminished electronic device performance.

SUMMARY OF THE INVENTION

Electronic devices and methods of making electronic devices are described. More specifically, the electronic devices include an acene-thiophene copolymer. The acene-thiophene copolymer can be used, for example, in a semiconductor layer or in a layer positioned between a first electrode and a second electrode.

In one aspect, an electronic device is provided that contains an acene-thiophene copolymer of Formula I.

I

In Formula I, Ac is a radical of an acene having 2 to 5 fused aromatic rings. The acene can be unsubstituted or substituted with a substituent selected from an alkyl, alkoxy, thioalkyl, aryl, aralkyl, halo, haloalkyl, hydroxyalkyl, heteroalkyl, alkenyl, or combinations thereof. Divalent group Q is of Formula II.

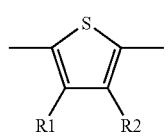

II

Each group R1 and R2 in Formula II is independently selected from hydrogen, alkyl, alkoxy, thioalkyl, aryl, aralkyl, halo, haloalkyl, hydroxyalkyl, heteroalkyl, alkenyl, or combinations thereof At least one of R1, R2, or the Ac substituent contains at least 4 carbon atoms. Subscript n is an integer equal to at least 4. The asterisks indicate the location of attachment to another group such as another repeat unit of formula —Ac-Q-.

In another aspect, a method of making an electronic device is provided. The method includes providing a layer that includes the acene-thiophene copolymer of Formula I.

The above summary of the present invention is not intended to describe each disclosed embodiment or every implementation of the present invention. The Figures, Detailed Description, and Examples that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
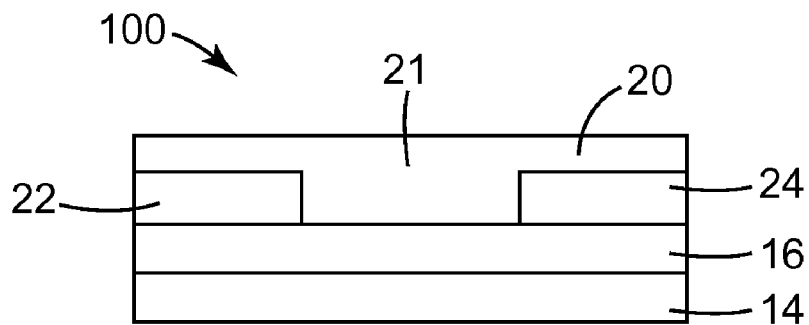
FIG. 1 is a schematic representation of a first exemplary organic thin film transistor.

The drawings are not meant to imply a certain thickness for any layer or to imply a certain relative thickness of various layers.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION OF THE INVENTION

The present invention provides electronic devices that contain an acene-thiophene copolymer. The acene-thiophene copolymer can be present, for example, in a layer that is adjacent to a dielectric layer, a conductive layer, or combinations thereof. More specifically, the acene-thiophene copolymer can function as a semiconducting material in electronic devices such as an organic thin film transistor or can be positioned between two electrodes in electronic devices such as an organic photovoltaic cell or an organic luminescent device.

The present invention also provides methods of making electronic devices that contain an acene-thiophene copolymer. The method includes providing a layer that contains the acene-thiophene copolymer. Providing this layer often involves preparing a coating solution that contains the acene-thiophene copolymer dissolved in a solvent, forming a solution layer from the coating solution on a surface, and removing at least some of the solvent from the solution layer. The layer containing the acene-thiophene copolymer is often formed on the surface of a substrate or on the surface of another layer in the electronic device.

As used herein, the terms "a", "an", and "the" are used interchangeably with "at least one" to mean one or more of the elements being described.

"Acene" refers to a polycyclic aromatic hydrocarbon group having at least 2 fused benzene rings in a rectilinear arrangement as shown by the following formula where m is an integer equal to or greater than zero.

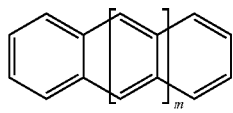

The acene usually has 2 to 5 fused benzene rings (i.e., naphthalene, anthracene, tetracene, and pentacene).

"Alkyl" refers to a monovalent group that is a radical of an alkane, which is a saturated hydrocarbon. The alkyl can be linear, branched, cyclic, or combinations thereof and typically contains 1 to 30 carbon atoms. In some embodiments, the alkyl group contains 4 to 30, 1 to 20, 4 to 20, 1 to 14, 1 to 10, 4 to 10, 4 to 8, 1 to 8, 1 to 6, or 1 to 4 carbon atoms. Examples of alkyl groups include, but are not limited to, methyl, ethyl, n-propyl, iso-propyl, n-butyl, tert-butyl, iso-butyl, n-pentyl, n-hexyl, cyclohexyl, n-octyl, n-heptyl, and ethylhexyl.

"Alkenyl" refers to a monovalent group that is a radical of an alkene, which is a hydrocarbon with at least one carbon-carbon double bond. The alkenyl can be linear, branched, cyclic, or combinations thereof and typically contains 2 to 30 carbon atoms. In some embodiments, the alkenyl contains 2 to 20, 2 to 14, 2 to 10, 4 to 10, 4 to 8, 2 to 8, 2 to 6, or 2 to 4 carbon atoms. Exemplary alkenyl groups include ethenyl, propenyl, and butenyl.

"Alkoxy" refers to a monovalent group of formula —OR where R is an alkyl group. Examples include, but are not limited to, methoxy, ethoxy, propoxy, and butoxy.

"Aryl" refers to a monovalent group that is a radical of an aromatic carbocyclic compound. The aryl can have one aromatic ring or can include up to 5 carbocyclic ring structures that are connected to or fused to the aromatic ring. The other ring structures can be aromatic, non-aromatic, or combinations thereof. Examples of aryl groups include, but are not limited to, phenyl, biphenyl, terphenyl, anthryl, naphthyl, acenaphthyl, anthraquinonyl, phenanthryl, anthracenyl, pyrenyl, perylenyl, and fluorenyl.

"Aralkyl" refers to an alkyl substituted with an aryl group.

"Halo" refers to a halogen group (i.e., —F, —Cl, —Br, or —I).

"Haloalkyl" refers to an alkyl that is substituted with one or more halo groups.

"Hydroxyalkyl" refers to an alkyl that is substituted with one or more hydroxy groups.

"Heteroalkyl" refers to an alkyl having one or more —CH$_2$— groups replaced with a thio, oxy, or —NR$^a$— where R$^a$ is hydrogen or alkyl. The heteroalkyl can be linear, branched, cyclic, or combinations thereof and can include up to 30 carbon atoms and up to 20 heteroatoms. In some embodiments, the heteroalkyl includes up to 25 carbon atoms, up to 20 carbon atoms, up to 15 carbon atoms, or up to 10 carbon atoms. Thioalkyl groups and alkoxy groups are subsets of heteroalkyl groups.

"Thioalkyl" refers to a monovalent group of formula —SR where R is an alkyl group.

An electronic device is provided that contains an acene-thiophene copolymer of Formula I.

In Formula I, Ac is a radical of an acene having 2 to 5 fused aromatic rings. The acene can be unsubstituted or substituted with a substituent selected from an alkyl, alkoxy, thioalkyl, aryl, aralkyl, halo, haloalkyl, hydroxyalkyl, heteroalkyl, alkenyl, or combinations thereof. Divalent group Q is of Formula II.

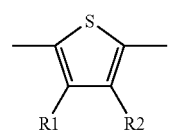

Each group R1 and R2 in Formula II is independently selected from hydrogen, alkyl, alkoxy, thioalkyl, aryl, aralkyl, halo, haloalkyl, hydroxyalkyl, heteroalkyl, alkenyl, or combinations thereof At least one of R1, R2, or the Ac substituent has at least 4 carbon atoms. Subscript n is an integer equal to at least 4. The asterisks indicate the location of attachment to another group such as another repeat unit of formula —Ac-Q-.

The Ac group is a radical (e.g., a divalent radical) of an acene. The acene can have two to five fused rings arranged in a rectilinear manner (i.e., suitable acenes include naphthalene, anthracene, tetracene, and pentacene). Acenes are commonly given a numbering sequence in which each carbon atom that is a member of only one ring is numbered. Various positions of exemplary acene-diyls (i.e., divalent radicals of an acene) are shown in the following structures for naphthylene-2,6-diyl,

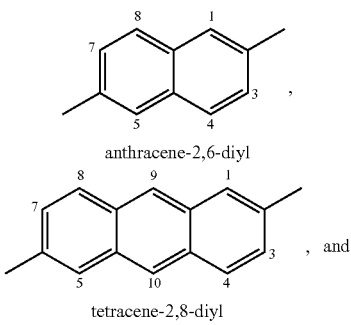

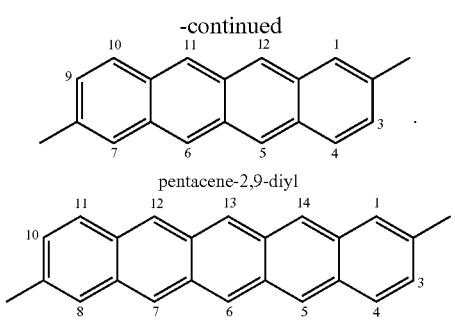

pentacene-2,9-diyl

Each Ac group can be unsubstituted or substituted with a substituent selected from an alkyl, alkoxy, thioalkyl, aryl, aralkyl, halo, haloalkyl, hydroxyalkyl, heteroalkyl, alkenyl, or combinations thereof. As used herein with reference to the Ac group, the term "substituent" refers to a group attached to Ac other than group Q, another repeat unit of formula —Ac-Q-, or an end group for the polymer. Likewise, the term "unsubstituted" means that Ac is free of a substituent. When referring to Ac substituents, the term "combinations thereof" can refer either to multiple substituents on the Ac group or to a first substituent that is further substituted with a second substituent. At least in some embodiments, the addition of one or more substituents tend to increase the solubility of the copolymer of Formula I in organic solvents or tends to improve the compatibility of the copolymer with various coating compositions.

Group Q can be attached to any position of Ac. The acene-thiophene copolymer of Formula I lacks any bithiophene or polythiophene group. That is, any two Ac groups are separated by a single group Q of Formula II. In many embodiments, Q is attached to an outer aromatic ring of Ac. As used herein, the term "outer aromatic ring" refers to an aromatic ring of an acene that is fused to only one other aromatic ring. In some copolymers, group Q is attached to an outer aromatic ring of Ac such as at positions 1, 2, 3, 4, 5, 6, 7, or 8 for an Ac group based on naphthalene or anthracene, at positions 1, 2, 3, 4, 7, 8, 9, or 10 for an Ac group based on tetracene, or at positions 1, 2, 3, 4, 8, 9, 10, or 11 for an Ac group based on pentacene. In other embodiments, Q is attached to an inner aromatic ring of Ac. As used herein, the term "inner aromatic ring" refers to an aromatic ring of an acene that is fused to two other aromatic rings. In some copolymers, group Q is attached to an inner aromatic ring of Ac such as at positions 9 or 10 for an Ac group based on anthracene, at positions 5, 6, 11, or 12 for an Ac group based on tetracene, or at positions 5, 6, 7, 12, 13, or 14 for an Ac group based on pentacene.

In addition to being attached to group Q, the Ac group is attached to a second group such as another repeat unit of formula —Ac-Q- (i.e., the resulting copolymeric material has a subscript n equal to at least 5) or an end group of the polymer. If group Q in Formula I is attached to an inner aromatic ring of the Ac group, the second group is often attached to the same inner aromatic ring. If group Q is attached to an outer aromatic ring of the Ac group, the second group is often bonded to the opposite outer aromatic ring. That is, group Q and the second group are often attached to opposite distal ends of the Ac group. Exemplary Ac groups include, but are not limited to, naphthalene-2,6-diyl, naphthalene-2,7-diyl, anthracene-2,6-diyl, anthracene-2,7-diyl, anthracene-9,10-diyl, tetracene-2,8-diyl, tetracene-2,9-diyl, pentacene-2,9-diyl, pentacene-2,10-diyl, or pentacene-6,13-diyl that is unsubstituted or substituted with a substituent selected from an alkyl, alkoxy, thioalkyl, aryl, aralkyl, halo, haloalkyl, hydroxyalkyl, heteroalkyl, alkenyl, or combinations thereof The position numbers indicate the carbon where the Q group and the second group are attached to the Ac group.

In some applications such as those in which the copolymers function as semiconductor materials, it may be desirable to select an Ac group that has an extended conjugation length in a linear direction. That is, in some applications, it is preferable that the Q group is attached to an outer aromatic ring of the acene. Exemplary Ac groups include, but are not limited to, naphthalene-2,6-diyl, anthracene-2,6-diyl, tetracene-2,8-diyl, or pentacene-2,9-diyl that is unsubstituted or substituted with a substituent selected from an alkyl, alkoxy, thioalkyl, aryl, aralkyl, halo, haloalkyl, hydroxyalkyl, heteroalkyl, alkenyl, or combinations thereof. In some specific applications of the copolymers, the Ac group is anthracene-2,6-diyl that is unsubstituted or substituted with a substituent selected from an alkyl, alkoxy, thioalkyl, aryl, aralkyl, halo, haloalkyl, hydroxyalkyl, heteroalkyl, alkenyl, or combinations thereof.

Group Q is of Formula II as described above. Each group R1 and R2 is independently selected from hydrogen, alkyl, alkoxy, thioalkyl, aryl, aralkyl, halo, haloalkyl, hydroxyalkyl, heteroalkyl, alkenyl, or combinations thereof. When referring to groups R1 and R2, the term "combinations thereof" refers to a first group that is further substituted with another group.

There is at least one R1 group, R2 group, or Ac substituent that contains at least 4 carbon atoms such as 4 to 30 carbon atoms, 4 to 20 carbon atoms, 4 to 16 carbon atoms, or 4 to 10 carbon atoms. More specifically, there is at least one R1 group, R2 group, or Ac substituent selected from an alkyl having at least 4 carbon atoms, an alkoxy having at least 4 carbon atoms, a thioalkyl having at least 4 carbon atoms, an aryl having at least 6 carbon atoms, an aralkyl having at least 10 carbon atoms, a haloalkyl having at least 4 carbon atoms, a hydroxyalkyl having at least 4 carbon atoms, a heteroalkyl having at least 4 carbon atoms, an alkenyl having at least 4 carbon atoms, or combinations thereof. The selection of at least one such group can often increase the solubility of the acene-thiophene copolymer of Formula I in common organic solvents or can often improve the compatibility of the acene-thiophene copolymer with various coating compositions.

Some exemplary copolymers have only one groups selected from R1, R2, and the Ac substituent that contains at least 4 carbon atoms. Other exemplary copolymers have two groups selected from R1, R2, and the Ac substituent that contains at least 4 carbon atoms. In still other exemplary copolymers, all three of R1, R2, and the Ac substituent contain at least 4 carbon atoms. Any R1, R2, or Ac substituent that does not contain 4 carbon atoms can be hydrogen, halo, or can contain less than 4 carbon atoms.

If there is a single group selected from R1, R2, and the Ac substituent that has at least 4 carbon atoms but that group has less than 8 carbon atoms, the group is typically branched, cyclic, or combinations thereof. If there is a single group selected from R1, R2, and the Ac substituent that has at least 4 carbon atoms but that group has at least 8 carbon atoms, the group can be linear, branched, cyclic, or combinations thereof. If there are multiple groups selected from R1, R2, and the Ac substituent that have at least 4 carbon atoms, each group can independently be linear, branched, cyclic, or combinations thereof.

In some exemplary copolymers, at least one group selected from R1 or R2 has 4 at least carbon atoms. For example, R1 can be selected from hydrogen, halo, or a group that has less than 4 carbon atoms and R2 can be selected from an alkyl having at least 4 carbon atoms, an alkoxy having at least 4 carbon atoms, a thioalkyl having at least 4 carbon atoms, an aryl having at least 6 carbon atoms, an aralkyl having at least 10 carbon atoms, a haloalkyl having at least 4 carbon atoms, a hydroxyalkyl having at least 4 carbon atoms, a heteroalkyl having at least 4 carbon atoms, an alkenyl having at least 4 carbon atoms, or a combination thereof. The Ac group can be unsubstituted or substituted in these exemplary copolymers.

In other exemplary copolymers, both R1 and R2 independently are an alkyl having at least 4 carbon atoms, an alkoxy having at least 4 carbon atoms, a thioalkyl having at least 4 carbon atoms, an aryl having at least 6 carbon atoms, an aralkyl having at least 10 carbon atoms, a haloalkyl having at least 4 carbon atoms, a hydroxyalkyl having at least 4 carbon atoms, a heteroalkyl having at least 4 carbon atoms, an alkenyl having at least 4 carbon atoms, or a combination thereof. In some of these exemplary copolymers, R1 is identical to R2. The Ac group can be unsubstituted or substituted in these exemplary copolymers.

In still other exemplary copolymers, both R1 and R2 are hydrogen, halo, or have less than 4 carbon atoms and the acene has at least one substituent that has 4 carbon atoms. That is, at least one Ac substituent is an alkyl having at least 4 carbon atoms, an alkoxy having at least 4 carbon atoms, a thioalkyl having at least 4 carbon atoms, an aryl having at least 6 carbon atoms, an aralkyl having at least 10 carbon atoms, a haloalkyl having at least 4 carbon atoms, a hydroxyalkyl having at least 4 carbon atoms, a heteroalkyl having at least 4 carbon atoms, an alkenyl having at least 4 carbon atoms, or a combination thereof.

Exemplary linear alkyl groups having at least 8 carbon atoms include, but are not limited to, n-octyl, n-decyl, tetradecyl, hexadecyl, and the like. Exemplary alkyl groups having at least 4 carbon atoms that are branched, cyclic, or combinations thereof include, but are not limited to, sec-butyl, 2,2-dimethylpropyl, 3,5,5-trimethylhexyl, 2,3-dimethylpentyl, 2-ethylhexyl, 2-methylpentyl, 3-methylbutyl, 3-methylpentyl, 2-ethyl-3-methylbutyl, 2-(3,3-dimethylcyclohexyl)ethyl, and 2,5,7,7-tetramethyloctyl. These alkyl groups can be part of other groups such as alkoxy, thioalkyl, aralkyl, haloalkyl, hydroxyalkyl, or heteroalkyl groups. Specific branched heteroalkyl groups include, but are not limited to, 3,7-dimethyl-7-methoxyoctyl and 3-methylmercaptobutyl. Specific branched aralkyl groups include, but are not limited to, 2-methyl-4-phenylpentyl.

Exemplary linear alkenyl groups having at least 8 carbon atoms include, but are not limited to, cis-11-hexadecenyl, cis-4-heptadecenyl, cis-13-octadecenyl, cis-9hexadecenyl, cis-8-undecenyl, cis-7-decenyl, cis-3-nonenyl cis-6-nonenyl, and (E,Z)-2,6-dodecadienyl. Exemplary alkenyl groups having at least 4 carbon atoms that are branched, cyclic, or combinations thereof include, but are not limited to, 2-methy-4-(2,6,6-trimethyl-2-cyclohexenyl)-3-butenyl, 2-(2,2,3-trimethyl-3-cyclopentenyl)ethyl, 2-(2,6,6-trimethyl-1-cyclohexenyl)ethyl, 2-(2,2,3-trimethyl-3-cyclopentenyl)ethyl, 1,2,3,4,5,6,7,8-octahydro-8,8-dimethyl-2-naphthyl, 3,7-dimethyl-6-octenyl, 2,6-dimethyl-5-heptenyl, and 2-methyl-4-(2,6,6-trimethyl-1-cyclohexenyl)butyl.

The copolymers of Formula I can be prepared using Suzuki coupling reactions such as shown in Reaction Scheme A.

Reaction Scheme A

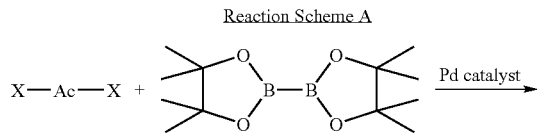

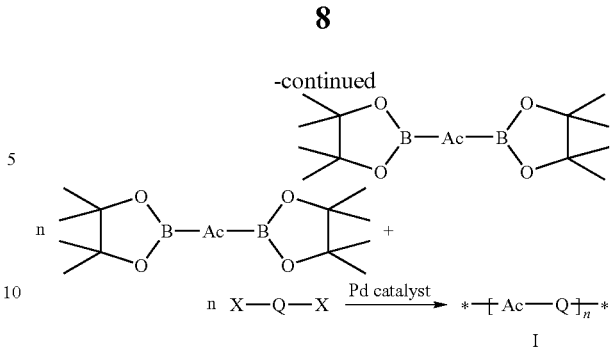

A dihaloacene is initially reacted with a dioxaborolane such as bis(pinacolato)diboron to form an acene compound having two dioxaborolane groups (e.g., tetramethyldioxaborolane). The acene compound with two dioxaborolane groups is then reacted with a dihalothiophene compound. The halo groups in the second reaction can be the same or different than the halo groups in the first reaction. Both of these reactions typically take place in the presence of a palladium catalyst such as, for example, tetrakis(triphenyl)phosphine)palladium(0). As an alternative to Reaction Scheme A, a dihalothiophene compound can initially be reacted with a dioxaborolane and then reacted with a dihaloacene using Suzuki coupling reactions. Suzuki coupling reactions are further described in the article Ito et al., *Angew. Chem., Int. Ed.*, 42, 1159-1162 (2003).

Stille coupling reactions can also be used to synthesize the copolymers of Formula I as shown in Reaction Scheme B.

Reaction Scheme B

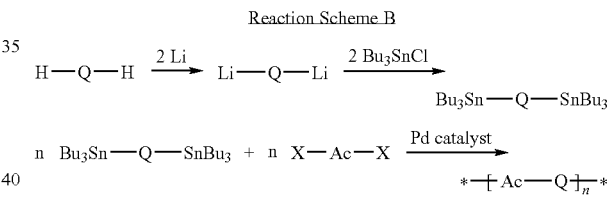

A thiophene compound can be lithiated and then reacted with a trialkylstannate such as tributyltin chloride to form a thiophene compound substituted with two trialkylstannate groups. The resulting thiophene compound can then be reacted with a dihaloacene in the presence of a palladium catalyst. As an alternative to Reaction Scheme B, an acene can be lithiated and then reacted with a trialkylstannate to form an acene substituted with two trialkylstannate groups. The resulting acene compound can then be reacted with a dihalothiophene in the presence of a palladium catalyst. Stille coupling reactions are further described in the articles Miller et al., *J. Org. Chem.*, 60, 6813-6819 (1995) and Katz et al., *Acc. Chem. Res.*, 34, 359-369 (2001).

Halogenated acenes (i.e., dihaloacenes) for use in either Suzuki or Stille coupling reactions are either commercially available or can be synthesized from commercially available materials. For example, 1,4-dibromonapthalene, 2,6-dibromonapthalene, 9,10-dibromoanthracene are available from either Alfa Aesar or Sigma Aldrich. 2,6-dibromoanthracene can be prepared from commercially available 2,6-diaminoanthraquinone (Sigma Aldrich) as described by Hodge et al, *Chem Comm.*, 73 (1997). 1,4-dichlorotetracene, 5,12-dichlorotetracene, 5,11-dibromotetracene, and 5,11-dichlorotetracene can be prepared as described in the article Clar et al, *Tetrahedron,* 28, 5049 (1972) and the references cited therein. Dihalopentacenes substituted in the 2,9 and 2,10 positions can be synthesized as shown in Reaction Scheme C. The reaction of a halobenzene with pyromellitic anhydride under typical Friedel-Crafts conditions (e.g., AlCl₃, which is a strong Lewis Acid) in an inert solvent or with halobenzene as solvent with heat gives the two isomeric bis(halobenzoyl) phthalic acids A and B. These isomers can be separated by fractional recrystallization, chromatography or by differences in solubility. Further reactions of the individual bis (halobenzoyl)phthalic acids A and B are carried on separately first by cyclization to the corresponding tetrones C and D using triflic acid followed by reduction to the desired pentacenes E and F with sodium borohydride and stannous chloride. The R3 groups below are hydrogen or substituent groups.

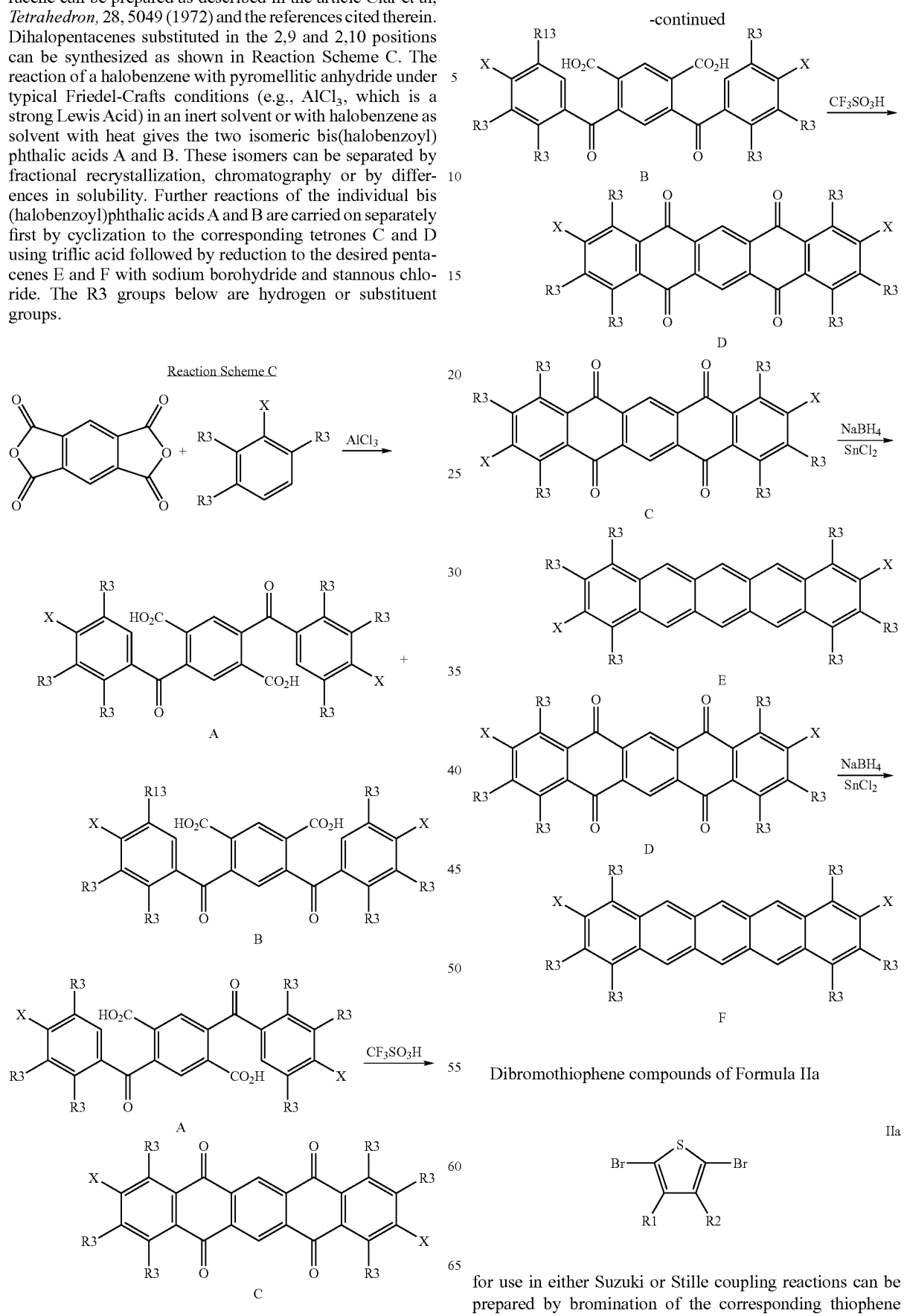

Dibromothiophene compounds of Formula IIa for use in either Suzuki or Stille coupling reactions can be prepared by bromination of the corresponding thiophene compound. That is, the corresponding thiophene can be reacted with a brominating agent such as N-bromosuccinimide (NBS). For example, a compound of Formula IIa with R1 and R2 equal to alkyl groups can be prepared by reacting a 3,4-dihalothiophene with two moles of a Grignard reagent containing the desired alkyl groups followed by a bromination reaction. This method is further described in the article Vidal et al., *Chem. Eur. J.*, 6, 1663-1673 (2000).

The copolymers of Formula I typically have a weight average molecular weight of at least 5,000 g/mole. In some embodiments, the weight average molecular weight is at least 7,000 g/mole, at least 8,000 g/mole, at least 10,000 g/mole, at least 12,000 g/mole or at least 15,000 g/mole. The weight average molecular weight can be determined using Gel Permeation Chromatography.

If desired, the purity of the copolymeric material can be increased using techniques known in the art such as additional precipitation steps or Soxhlet extraction.

Layers in an electronic device that contain the acene-thiophene copolymer of Formula I often are prepared from solvent-based compositions. For example, compositions that contain the acene-thiophene copolymer and a solvent can be used to provide a coating. The coating can be formed by applying the compositions to a surface such as a surface of a substrate or to a surface of another layer in an electronic device. The coating can be applied using any suitable application technique such as, for example, spray coating, spin coating, dip coating, knife coating, gravure coating, inkjet printing, and transfer printing. The solvent can be removed from the coating after application by evaporating under ambient conditions (e.g., at about 20° C. to about 25° C.) or by drying at an elevated temperature such as a temperature up to about 80° C., up to about 100° C., up to about 120° C., up to about 150° C., or up to about 200° C.

In some exemplary methods of preparing an electronic device, the method involves providing a first layer selected from a dielectric layer, a conductive layer, or a substrate and disposing a layer containing the acene-thiophene copolymer of Formula I adjacent to the first layer. No specific order of preparing or providing is necessary; however, the layer containing the acene-thiophene copolymer is often prepared on the surface of another layer such as the dielectric layer, the conductive layer, or the substrate. The conductive layer can include, for example, a source electrode and a drain electrode, an anode, or a cathode.

As used herein, the terms "disposed", "disposing", "deposited", "depositing", and "adjacent" do not preclude the presence of another layer between the mentioned layers. As used herein, these terms mean that a first layer is positioned near a second layer. The first layer often contacts the second layer but a third layer could be positioned between the first layer and the second layer.

The acene-thiophene copolymers of Formula I can function as semiconductor materials within some electronic devices. That is, the electronic device can be a semiconductor device that contains a semiconductor layer that includes the acene-thiophene copolymer of Formula I. Semiconductor devices have been described, for example, by S. M. Sze in *Physics of Semiconductor Devices*, $2^{nd}$ edition, John Wiley and Sons, New York (1981). Such devices include rectifiers, transistors (of which there are many types, including p-n-p, n-p-n, and thin-film transistors), photoconductors, current limiters, thermistors, p-n junctions, field-effect diodes, Schottky diodes, and the like. Semiconductor devices can include components such as transistors, arrays of transistors, diodes, capacitors, embedded capacitors, and resistors that are used to form circuits. Semiconductor devices also can include arrays of circuits that perform an electronic function.

Examples of these arrays or integrated circuits include inverters, oscillators, shift registers, and logic circuits. Applications of these semiconductor devices and arrays include radio frequency identification devices (RFIDs), smart cards, display backplanes, sensors, memory devices, and the like.

Some of the semiconductor devices are organic thin-film transistors as shown schematically in FIGS. 1 to 6. Any given layer in the various thin film transistors shown in FIGS. 1 to 6 can include multiple layers of materials. Further, any layer can include a single material or multiple materials.

One embodiment of an organic thin-film transistor 100 is shown schematically in FIG. 1. The organic thin-film transistor (OTFT) 100 includes a gate electrode 14, a gate dielectric layer 16 disposed on the gate electrode 14, a source electrode 22, a drain electrode 24, and a semiconductor layer 20 that is in contact with both the source electrode 22 and the drain electrode 24. The source electrode 22 and the drain electrode 24 are separated from each other (i.e., the source electrode 22 does not contact the drain electrode 24) and are positioned adjacent to the dielectric layer 16. Both the source electrode 22 and the drain electrode 24 are in contact with the semiconducting layer 20 such that a portion of the semiconductor layer is positioned between the source electrode and the drain electrode. The portion of the semiconductor layer that is positioned between the source electrode and the drain electrode is referred to as the channel 21. The channel is adjacent to the gate dielectric layer 16. Some semiconductor devices have an optional surface treatment layer between the gate dielectric layer 16 and the semiconductor layer 20.

An optional substrate can be included in the organic thin-film transistors. For example, the optional substrate 12 can be adjacent to the gate electrode 14 as shown schematically in FIG. 2 for the OTFT 200 or adjacent to the semiconductor layer 20 as shown schematically in FIG. 3 for the OTFT 300. The OTFT 300 can include an optional surface treatment layer between the substrate 12 and the semiconductor layer 20.

Figure 4:
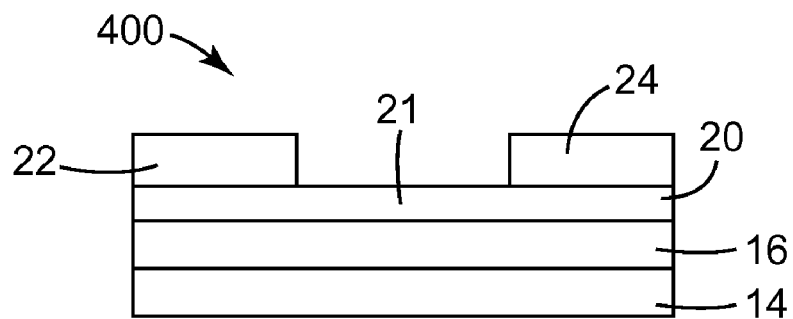
FIG. 4 is a schematic representation of a fourth exemplary organic thin film transistor.

Another embodiment of an organic thin-film transistor is shown schematically in FIG. 4. This organic thin-film transistor 400 includes a gate electrode 14, a gate dielectric layer 16 disposed on the gate electrode 14, a semiconductor layer 20, and a source electrode 22 and a drain electrode 24 disposed on the semiconductor layer 20. In this embodiment, the semiconductor layer 20 is between the gate dielectric layer 16 and both the source electrode 22 and the drain electrode 24. The source electrode 22 and the drain electrode 24 are separated from each other (i.e., the source electrode 22 does not contact the drain electrode 24). Both the source electrode 22 and the drain electrode 24 are in contact with the semiconducting layer such that a portion of the semiconductor layer is positioned between the source electrode and the drain electrode. The channel 21 is the portion of the semiconductor layer that is positioned between the source electrode 22 and the drain electrode 24. One or more optional surface treatment layers can be included in the semiconductor device. For example, an optional surface treatment layer can be included between the gate dielectric layer 16 and the semiconductor layer 20.

An optional substrate can be included in the organic thin-film transistors. For example, the optional substrate 12 can be in contact with the gate electrode 14 as shown schematically in FIG. 5 for the OTFT 500 or in contact with the semiconductor layer 20 as shown schematically in FIG. 6 for the OTFT 600. OTFT 600 can include an optional surface treatment layer between the substrate 12 and the semiconductor layer 20.

In operation of the semiconductor device configurations shown in FIGS. 1 to 6, voltage can be applied to the drain electrode 24. However, no charge (i.e., current) is passed to the source electrode 22 unless voltage is also applied to the gate electrode 14. That is, unless voltage is applied to the gate electrode 14, the channel 21 in the semiconductor layer 20 remains in a non-conductive state. Upon application of voltage to the gate electrode 14, the channel 21 becomes conductive and charge flows through the channel 21 from the source electrode 22 to the drain electrode 24.

A substrate 12 often supports the OTFT during manufacturing, testing, and/or use. Optionally, the substrate can provide an electrical function for the OTFT. For example, the backside of the substrate can provide electrical contact. Useful substrate materials include, but are not limited to, inorganic glasses, ceramic materials, polymeric materials, filled polymeric materials (e.g., fiber-reinforced polymeric materials), metals, paper, woven or non-woven cloth, coated or uncoated metallic foils, or a combination thereof.

The gate electrode 14 can include one or more layers of a conductive material. For example, the gate electrode can include a doped silicon material, a metal, an alloy, a conductive polymer, or a combination thereof. Suitable metals and alloys include, but are not limited to, aluminum, chromium, gold, silver, nickel, palladium, platinum, tantalum, titanium, indium tin oxide (ITO), fluorine tin oxide (FTO), antimony doped tin oxide (ATO), or a combination thereof. Exemplary conductive polymers include, but are not limited to, polyaniline, poly(3,4-ethylenedioxythiophene)/poly(styrene sulfonate), or polypyrrole. In some organic thin film transistors, the same material can provide both the gate electrode function and the support function of the substrate. For example, doped silicon can function as both the gate electrode and as the substrate.

The gate electrode in some embodiments if formed by coating a substrate surface with a dispersion that contains conductive materials such as nanoparticles that are conductive or polymeric materials that are conductive. Conductive nanoparticles include, but are not limited to, ITO nanoparticles, ATO nanoparticles, silver nanoparticles, gold nanoparticles, or carbon nanotubes.

The gate dielectric layer 16 is disposed on the gate electrode 14. This gate dielectric layer 16 electrically insulates the gate electrode 14 from the balance of the OTFT device. Useful materials for the gate dielectric include, for example, an inorganic dielectric material, a polymeric dielectric material, or a combination thereof The gate dielectric can be a single layer or multiple layers of suitable dielectric materials. Each layer in a single or multilayer dielectric can include one or more dielectric materials.

The organic thin film transistors can include an optional surface treatment layer disposed between the gate dielectric layer 16 and at least a portion of the organic semiconductor layer 20 or disposed between the substrate 12 and at least a portion of the organic semiconductor layer 20. In some embodiments, the optional surface treatment layer serves as an interface between the gate dielectric layer and the semiconductor layer or between the substrate and the semiconductor layer. The surface treatment layer can be a self-assembled monolayer as described in U.S. Pat. No. 6,433,359 B1 (Kelley et al.) or a polymeric material as described in U.S. Patent Application Publication 2003/0102471 A1 (Kelley et al.) and U.S. Pat. No. 6,617,609 (Kelley et al.).

The source electrode 22 and drain electrode 24 can be metals, alloys, metallic compounds, conductive metal oxides, conductive ceramics, conductive dispersions, and conductive polymers, including, for example, gold, silver, nickel, chromium, barium, platinum, palladium, aluminum, calcium, titanium, indium tin oxide (ITO), fluorine tin oxide (FTO), antimony tin oxide (ATO), indium zinc oxide (IZO), poly(3,4-ethylenedioxythiophene)/poly(styrene sulfonate), polyaniline, other conducting polymers, alloys thereof, combinations thereof, and multiple layers thereof. Some of these materials are appropriate for use with n-type semiconductor materials and others are appropriate for use with p-type semiconductor materials, as is known in the art.

The organic thin film transistors exemplified in FIGS. 1 to 3 can be prepared by a method that involves arranging multiple layers in the following order: a gate electrode; a gate dielectric layer; a layer having a source electrode and a drain electrode that are separated from each other; and a semiconductor layer in contact with both the source electrode and the drain electrode. The semiconductor layer includes an acene-thiophene copolymer of Formula I.

For example, the organic thin film transistor shown schematically in FIG. 1 can be prepared by providing a gate electrode 14; depositing a gate dielectric layer 16 adjacent to the gate electrode 14; positioning a source electrode 22 and a drain electrode 24 adjacent to the gate dielectric layer 16 such that the source electrode 22 and the drain electrode 24 are separated from each other; and forming a semiconductor layer 20 that is deposited on the source electrode 22, on the drain electrode 24, and in the area 21 between the source electrode 22 and the drain electrode 24. The semiconductor layer 20 contacts both the source electrode 22 and the drain electrode 24. The portion of the semiconductor layer that is positioned in the area between the source electrode and the drain electrode defines a channel.

Figure 2:
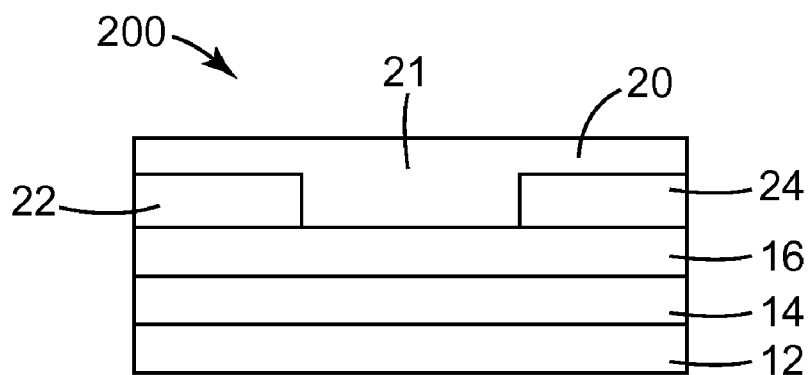
FIG. 2 is a schematic representation of a second exemplary organic thin film transistor.

The organic thin film transistor shown schematically in FIG. 2 can be prepared by providing a substrate 12; depositing a gate electrode 14 on the substrate 12; depositing a gate dielectric layer 16 adjacent to the gate electrode 14 such that the gate electrode 14 is positioned between the substrate 12 and the gate dielectric layer 16; positioning a source electrode 22 and a drain electrode 24 adjacent to the gate dielectric layer 16 such that the two electrodes are separated from each other; and forming a semiconductor layer 20 adjacent to the source electrode 22, the drain electrode 24, and in the area 21 between the source electrode 22 and the drain electrode 24. The semiconductor layer 20 contacts both the source electrode 22 and the drain electrode 24. The portion of the semiconductor layer that is positioned in the area between the source electrode and the drain electrode defines a channel.

Figure 3:
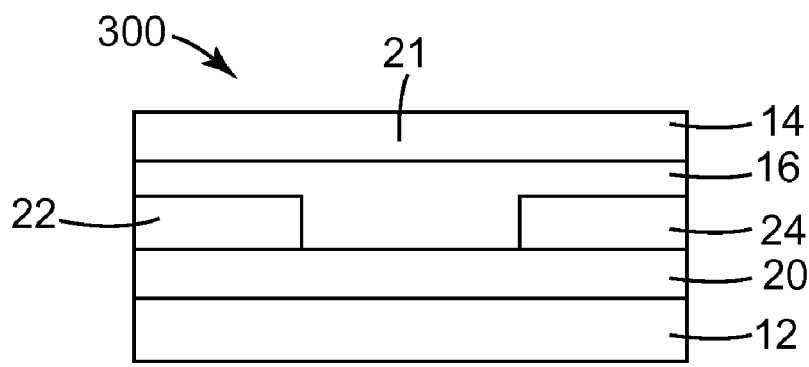
FIG. 3 is a schematic representation of a third exemplary organic thin film transistor.

The organic thin film transistor shown schematically in FIG. 3 can be prepared by providing a substrate 12; forming a semiconductor layer 20 adjacent to the substrate 12; positioning a source electrode 22 and a drain electrode 24 adjacent to the semiconductor layer 20 opposite the substrate 12 such that the source electrode 22 and drain electrodes 24 are separated from each other; depositing a gate dielectric layer 16 adjacent to the source electrode 22, the drain electrode 24, and a portion of the semiconducting layer 20 between the source electrode 22 and the drain electrode 24; and depositing a gate electrode 14 adjacent to the gate dielectric layer 16. Both the source electrode 22 and the drain electrode 24 contact the semiconductor layer 20. A portion of the semiconductor layer is positioned between the source electrode 22 and the drain electrode 24. This portion of the semiconductor layer defines a channel.

The organic thin film transistors shown schematically in FIGS. 4 to 6 can be prepared by a method that involves arranging multiple layers in the following order: a gate electrode; a gate dielectric layer; a semiconductor layer containing the acene-thiophene copolymer of Formula I; and a layer having a source electrode and a drain electrode that are separated from each other, wherein the semiconductor layer contacts both the drain electrode and the source electrode. In some embodiments, a surface treatment layer can be positioned between the gate dielectric layer and the semiconductor layer. A substrate can be positioned adjacent to the gate electrode or adjacent to the layer containing the source electrode and the drain electrode.

For example, the organic thin film transistor shown schematically in FIG. 4 can be prepared by providing a gate electrode 14; depositing a gate dielectric layer 16 adjacent to the gate electrode 14; forming a semiconductor layer 20 adjacent to the gate dielectric layer 16 (i.e., the gate dielectric layer 16 is positioned between the gate electrode 14 and the semiconducting layer 20); and positioning a source electrode 22 and a drain electrode 24 adjacent to the semiconductor layer 20. The source electrode 22 and the drain electrode 24 are separated from each other and both electrodes are in contact with the semiconductor layer 20. A portion of the semiconductor layer is positioned between the source and drain electrodes.

Figure 5:
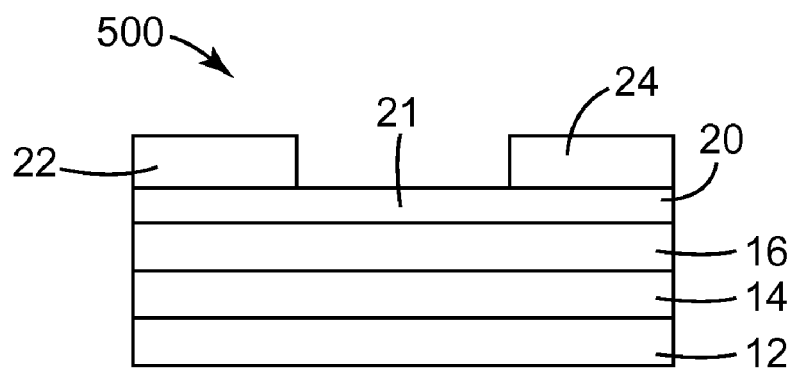
FIG. 5 is a schematic representation of a fifth exemplary organic thin film transistor.

The organic thin film transistor shown schematically in FIG. 5 can be prepared by providing a substrate 12, depositing a gate electrode 14 adjacent to the substrate 12, depositing a gate dielectric layer 16 adjacent to the gate electrode 14 such that the gate electrode 14 is positioned between the substrate 12 and the gate dielectric layer 16; forming a semiconductor layer 20 adjacent to the gate dielectric layer 16; and positioning a source electrode 22 and a drain electrode 24 adjacent to the semiconductor layer 20. The source electrode 22 and the drain electrode 24 are separated from each other and both electrodes are in contact with the semiconductor layer 20. A portion of the semiconductor layer 20 is positioned between the source electrode 22 and the drain electrode 24.

Figure 6:
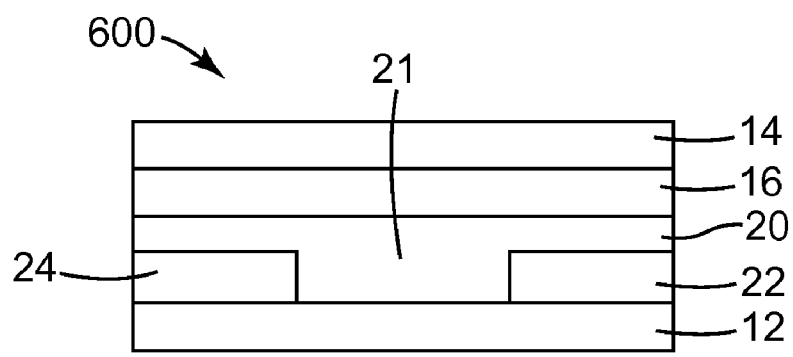
FIG. 6 is a schematic representation of a sixth exemplary organic thin film transistor.
Figure 7A:
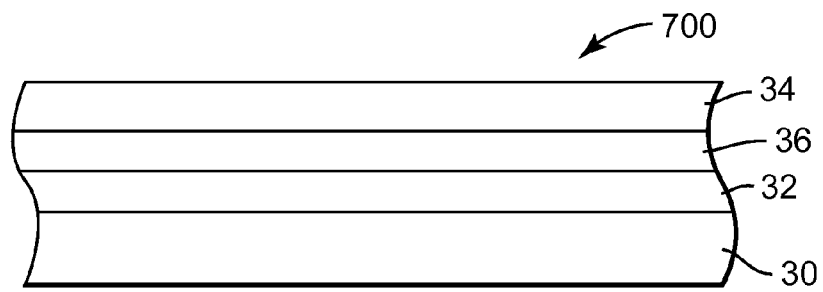
FIGS. 7A to 7D are schematic representations of various exemplary organic light emitting diodes.
Figure 7B:
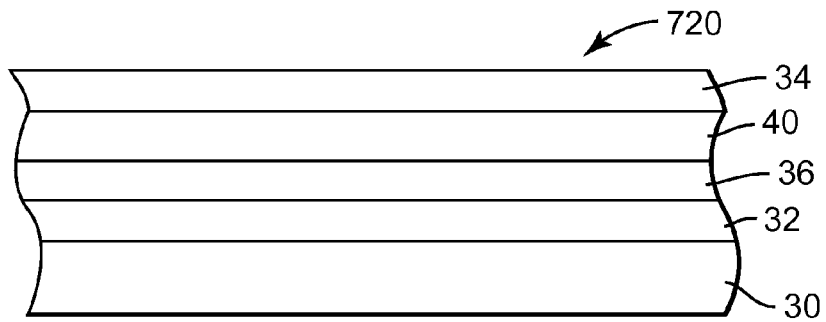
Figure 7C:
Figure 7D:
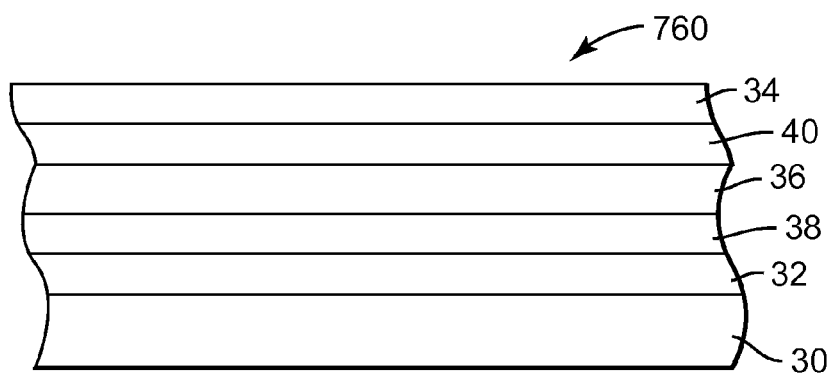

The organic thin film transistor shown schematically in FIG. 6 can be prepared by providing a substrate 12; positioning a source electrode 22 and a drain electrode 24 adjacent to the substrate such that the source electrode 22 and the drain electrode 24 are separated from each other; forming a semiconductor layer 20 that contacts the source electrode 22 and the drain electrode 24; and depositing a gate dielectric layer 16 adjacent to the semiconductor layer opposite the source electrode 22 and the drain electrode 24; and depositing a gate electrode 14 adjacent to the gate dielectric layer 16. A portion of the semiconductor layer 20 is positioned between the source electrode 22 and the drain electrode 24.

The acene-thiophene copolymers of Formula I can be used in other types of electronic devices such as electronic devices in which the copolymer is positioned in a layer between a first electrode (e.g., anode) and a second electrode (e.g., cathode). Exemplary electronic devices include, but are not limited to, organic photovoltaic cells and organic luminescent devices such as organic light emitting diodes.

Organic photovoltaic cells and organic luminescent devices include many common components such as an anode, a cathode, and a material positioned between the anode and cathode. However, the operation principals of these two types of devices are reversed. In an organic luminescent device, light is emitted as the result of charge transport between the two electrodes. An electron is introduced at a first electrode having a low work function (i.e., the cathode) and a hole is introduced at a second electrode having a high work function (i.e., the anode). In the organic emissive element positioned between the two electrodes, the electron and hole recombine and emit light. Conversely, in a photovoltaic cell, charge transport between the two electrodes results from the exposure of the active layer to light. The active layer, which is positioned between two electrodes, adsorbs light that passes through one of the electrodes. The absorption of light causes the formation of an exiton (i.e., an excited electron-hole pair) that is subsequently dissociated into an electron and a hole that migrate towards opposite electrodes.

Organic electroluminescent (OEL) devices such as organic light emitting diodes include an organic emissive element positioned between two electrodes (i.e., an anode and a cathode). The organic emissive element of an organic electroluminescent device usually includes at least one light emitting layer that include an electroluminescent material. Other layers can also be present in the organic emissive element such as hole transport layers, electron transport layers, hole injection layers, electron injection layers, hole blocking layers, electron blocking layers, buffer layers, and the like. In addition, photoluminescent materials can be present in the light emitting layer or other layers in the organic emissive element, for example, to convert the color of light emitted by the electroluminescent material to another color. These and other such layers and materials can be used to alter or tune the electronic properties and behavior of the layered OEL device. For example, the additional layers can be used to achieve a desired current/voltage response, a desired device efficiency, a desired color, a desired brightness, and the like.

FIGS. 7A to 7D illustrate examples of different OEL device (for example, an organic light emitting diode) configurations of the present invention. Each configuration includes a substrate 30, an anode 32, a cathode 34, and a light emitting layer 36. The configurations of FIGS. 7C and 7D also include a hole transport layer 38 and the configurations of FIGS. 7B and 7D include an electron transport layer 40. These layers conduct holes from the anode or electrons from the cathode, respectively. The acene-thiophene copolymer can be in a light emitting layer, a hole transport layer, or a combination thereof. Within any layer, the acene-thiophene copolymer may be present alone or in combination with other materials.

In some organic emissive elements, the acene-thiophene copolymer is present in a light emitting layer. The acene-thiophene copolymer can be used alone or in combination with one or more materials in the light emitting layer. For example, the copolymers can function as a host material or as a dopant material within a light emitting layer.

As used herein, the term "dopant" refers to a material that is capable of being excited by a transfer of energy from a host material. The excited dopant emits light. The dopant is typically present in an amount less than 50 weight percent, less than 40 weight percent, less than 20 weight percent, less than 10 weight percent, or less than 5 weight percent based on the weight of material in the light emitting layer. The dopant is typically present in an amount of at least 0.1 weight percent, 0.2 weight percent, 0.5 weight percent, or 1 weight percent based on the weight of material in the light emitting layer.

When the acene-thiophene copolymer is used as a dopant in the light emitting layer, it can be combined with host materials such as, for example, a charge transfer material. The charge transfer material is often a hole transfer material such as a diamine derivative, a triarylamine derivative, or a combination thereof. Exemplary diamine derivatives include, but are not limited to, N,N'-bis(3-methylphenyl)-N,N'-bis(phenyl)benzidine (TPD), N,N'-bis(2-naphthyl)-N,N'-bis(phenyl)benzidine (beta-NPB), and N,N'-bis(1-naphthyl)-N,N'-bis(phenyl)benzidine (NPB). Exemplary triarylamine derivative include, but are not limited to, 4,4',4"-Tris(N,N-diphenylamino)triphenylamine (TDATA) and 4,4',4"-Tris(N-3-methylphenyl-N-phenylamino)triphenylamine (MT-DATA). Still other host materials include electron transfer materials such as, for example, 9,10-di(2-naphthyl)anthracene (ADN) and oxadiazole compounds such as 1,3-bis[5-(4-(1,1-dimethylethyl)phenyl)-1,3,4-oxadiazol-2-yl]benzene and 2-(biphenyl-4-yl)-5-(4-(1,1-dimethylethyl)phenyl)-1,3,4-oxadiazole.

As used herein, the term "host" refers to a material that is capable of transferring energy to a dopant to form an excited dopant that emits light. The host material is typically present in an amount of at least at least 50 weight percent, at least 60 weight percent, at least 80 weight percent, or at least 90 weight percent based on the weight of material in the light emitting layer.

When the light emitting layer contains a host material and a dopant, the excited state of the host material is typically at a higher energy level than the excited state of the dopant so that energy can be transferred from the host material to the dopant. The excited host material typically emits light of a shorter wavelength than the excited dopant. For example, host material that emits blue light can transfer energy to a dopant that emits green or red light and a host material that emits green light can transfer energy to a dopant that emits red light but not to a dopant that emits blue light.

When the acene-thiophene copolymer is present in a light emitting layer of an organic emissive element, other light emitting materials can be present in the same light emitting layer or in different light emitting layers. Some light emitting layers have a small molecule (SM) emitter, a small molecule emitter doped polymer, a light emitting polymer (LEP), a small molecule emitter doped light emitting polymer, a blend of light emitting polymers, or a combination thereof. The emitted light from the organic emissive element can be in any portion of the visible spectrum depending on the composition of the electroluminescent composition in the light emitting layer or layers.

Suitable LEP materials are typically conjugated polymeric or oligomeric molecules that preferably have sufficient film-forming properties for solution processing. As used herein, "conjugated polymers or oligomeric molecules" refer to polymers or oligomers having a delocalized π-electron system along the polymer backbone. Such polymers or oligomers are semiconducting and can support positive or negative charge carriers along the polymeric or oligomeric chain.

Exemplary LEP materials include poly(phenylenevinylenes), poly(para-phenylenes), polyfluorenes, other LEP materials now known or later developed, and co-polymers or blends thereof. Suitable LEPs can also be doped with a small molecule emitter, dispersed with fluorescent dyes or photo-luminescent materials, blended with active or non-active materials, dispersed with active or non-active materials, and the like. Examples of suitable LEP materials are further described in Kraft, et al., *Angew. Chem. Int. Ed.*, 37, 402-428 (1998); U.S. Pat. Nos. 5,621,131; 5,708,130; 5,728,801; 5,840,217; 5,869,350; 5,900,327; 5,929,194; 6,132,641; and 6,169,163; and PCT Patent Application Publication No. 99/40655.

LEP materials can be formed into a light emitting structure, for example, by casting a solvent solution of the LEP material on a substrate and evaporating the solvent to produce a polymeric film. Alternatively, LEP material can be formed in situ on a substrate by reaction of precursor species. Suitable methods of forming LEP layers are described in U.S. Pat. No. 5,408,109. Other methods of forming a light emitting structure from LEP materials include, but are not limited to, laser thermal patterning, inkjet printing, screen printing, thermal head printing, photolithographic patterning, spraying, and extrusion coating.

Suitable SM electroluminescent materials include charge transporting, charge blocking, and semiconducting organic or organometallic compounds. Typically, SM materials can be vacuum deposited or coated from solution to form thin layers in a device. In practice, multiple layers of SM materials are typically used to produce efficient organic electroluminescent devices since a given material generally does not have both the desired charge transport and electroluminescent properties.

Exemplary SM materials include N,N'-bis(3-methylphenyl)-N,N'-diphenylbenzidine (TPD) and metal chelate compounds such as tris(8-hydroxyquinoline) aluminum (Alq3). Other SM materials are disclosed in, for example, C.H. Chen, et al., *Macromol. Symp.* 125, 1 (1997); Japanese Laid Open Patent Application 2000-195673; U.S. Pat. Nos. 6,030,715; 6,150,043; and 6,242,115; and PCT Patent Applications Publication Nos. WO 00/18851 (divalent lanthanide metal complexes), WO 00/70655 (cyclometallated iridium compounds and others), and WO 98/55561.

The anode 32 and cathode 34 are typically formed using conducting materials such as metals, alloys, metallic compounds, conductive metal oxides, conductive ceramics, conductive dispersions, and conductive polymers, including, for example, gold, silver, nickel, chromium, barium, platinum, palladium, aluminum, calcium, titanium, indium tin oxide (ITO), fluorine tin oxide (FTO), antimony tin oxide (ATO), indium zinc oxide (IZO), poly(3,4-ethylenedioxythiophene)/poly(styrene sulfonate), polyaniline, other conducting polymers, alloys thereof, combinations thereof, and multiple layers thereof. The anode 32 and the cathode 34 can be single layers of conducting materials or they can include multiple layers. For example, an anode or a cathode may include a layer of aluminum and a layer of gold, a layer of calcium and a layer of aluminum, a layer of aluminum and a layer of lithium fluoride, or a metal layer and a conductive organic layer.

A typical anode for an organic electroluminescent device is indium-tin-oxide (ITO) sputtered onto a transparent substrate such as plastic or glass. Suitable substrates include, for example, glass, transparent plastics such as polyolefins, polyethersulfones, polycarbonates, polyesters such as polyethylene naphthalate (PEN), polyarylates, and polymeric multilayer films, ITO coated barrier films such as the Plastic Film Conductor available from 3M (St. Paul, Minn.), surface-treated films, and selected polyimides.

The anode material coating the substrate is electrically conductive and may be optically transparent or semi-transparent. In addition to ITO, suitable anode materials include indium oxide, fluorine tin oxide (FTO), zinc oxide, vanadium oxide, zinc-tin oxide, gold, platinum, palladium, other high work function metals, and combinations thereof.

Optionally, the anode can be coated with a buffer layer to help provide a flat surface and to modify the effective work function of the anode. The buffer layer typically has a thickness up to 5000 Angstroms, up to 4000 Angstroms, up to 3000 Angstroms, up to 1000 Angstroms, up to 800 Angstroms, up to 600 Angstroms, up to 400 Angstroms, or up to 200 Angstroms. The buffer layer often has a thickness of at least 5 Angstroms, at least 10 Angstroms, or at least 20 Angstroms. The buffer layer can be vapor coated or solution coated.

Suitable buffer layers can be an ionic polymer such as poly(3,4-oxyethyleneoxy thiophene)/poly(styrene sulfonate), polyaniline emeraldine, or an acid doped polypyrrole. Other suitable buffer layers include those described in U.S. Patent Application No. 2004/0004433A1, incorporated herein by reference, that include (a) a hole transport material having triarylamine moieties and (b) an electron acceptor material. Suitable hole transport material can be a small molecule or a polymeric material. Exemplary hole transport material include, but are not limited to, 4,4',4"-tris(N,N-diphenylamino)triphenylamine (TDATA), 4,4",44"-tris(N-3-methylphenyl-N-phenylamino)triphenylamine (MTDAA), 4,4',4"-tris(carbozole-9-yl)triphenylamine (TCTA), and 4,4',4"-tris(N-naphthyl)-N-phenylamino)triphenylamine (2-TNATA). Exemplary electron transport materials that can be included in such a buffer layer include, but are not limited to, tetracyanoquinodimethane (TCNQ), tetafluoro-tetracynaoquinodimethan, tetracyanoethylene, chloranil, 2-(4-(1-methylethyl)phenyl-6-phenyl-4H-thiopyran-4-ylidene)-propanedinitrile-1,1-dioxyide (PTYPD), and 2,4,7-trinitrofluorene.

Typical cathodes include low work function metals such as aluminum, barium, calcium, samarium, magnesium, silver, magnesium/silver alloys, lithium, lithium fluoride, ytterbium, and of calcium/magnesium alloys. The cathode can be a single layer or multiple layers of these materials. For example, the cathode can include a layer of lithium fluoride, a layer of aluminum, and a layer of silver.

The hole transport layer 38 facilitates the injection of holes from the anode into the device and their migration towards the recombination zone. The hole transport layer 38 can further act as a barrier for the passage of electrons to the anode 32. In some examples, the acene-thiophene copolymer can be used in the hole transport layer. In other examples, the hole transport layer 38 can include, for example, a diamine derivative, such as N,N'-bis(3-methylphenyl)-N,N'-bis(phenyl)benzidine (TPD), N,N'-bis(2-naphthyl)-N,N'-bis(phenyl)benzidine (beta-NPB), and N,N'-bis(1-naphthyl)-N,N'-bis(phenyl) benzidine (NPB); or a triarylamine derivative, such as, 4,4',4"-tris(N,N-diphenylamino)triphenylamine (TDATA), 4,4',4"-tris(N-3-methylphenyl-N-phenylamino)triphenylamine (MTDATA), 4,4',4"-tri(N-phenoxazinyl) triphenylamine (TPOTA), and 1,3,5-tris(4-diphenylaminophenyl)benzene (TDAPB).

The electron transport layer 40 facilitates the injection of electrons from the cathode into the device and their migration towards the recombination zone. The electron transport layer 40 can further act as a barrier for the passage of holes to the cathode 34. In some examples, the electron transport layer 40 can be formed using the organometallic compound such as tris(8-hydroxyquinolato) aluminum (Alq3) and biphenylato bis(8-hydroxyquinolato)aluminum (BAlq). Other examples of electron transport materials useful in electron transport layer 260 include 1,3-bis[5-(4-(1,1-dimethylethyl)phenyl)-1,3,4-oxadiazol-2-yl]benzene; 2-(biphenyl-4-yl)-5-(4-(1,1-dimethylethyl)phenyl)-1,3,4-oxadiazole; 9,10-di(2-naphthyl)anthracene (ADN); 2-(4-biphenyl)-5-(4-t-butylphenyl)-1,3,4-oxadiazole; or 3-(4-biphenylyl)-4-phenyl-5-(4-tert-butylphenyl)-1,2,4-triazole (TAZ).

Other layers such as, for example, additional hole injection layers containing, for example, porphyrinic compounds like copper phthalocyanine (CuPc) and zinc phthalocyanine; electron injection layers containing, for example, alkaline metal oxides or alkaline metal salts; hole blocking layers containing, for example, molecular oxadiazole and triazole derivatives such as 2-(4-biphenyl)-5-(4-t-butylphenyl)-1,3,4-oxadiazole (PBD), 2,9-dimethyl-4,7-diphenyl-1,10-phenanthraline (BCP), biphenylato bis(8-hydroxyquinolato) aluminum (BAlq), or 3-(4-biphenylyl)-4-phenyl-5-(4-tert-butylphenyl)-1,2,4-triazole (TAZ); electron blocking layers containing, for example, N,N'-bis(1-naphthyl)-N,N'-bis(phenyl) benzidine (NPB), or 4,4',4"-tris(N-(3-methylphenyl)-N-phenylamino)triphenylamine (MTDATA); or the like can also be present in organic emissive element. In addition, photoluminescent materials can be present in these layers, for example, to convert the color of light emitted by the electroluminescent material to another color. These and other such layers and materials can be used to alter or tune the electronic properties and behavior of the layered OEL device, for example, to achieve one or more features such as a desired current/voltage response, a desired device efficiency, a desired color, a desired brightness, a desired device lifetime, or a desired combination of these features.

Figure 8:
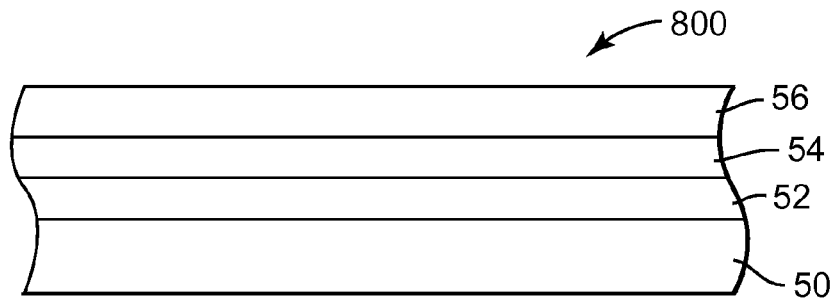
FIG. 8 is a schematic representation of an exemplary photovoltaic cell.

FIG. 8 schematically illustrates an exemplary photovoltaic cell, which is another type of electronic device that can contain the acene-thiophene copolymer of Formula I. An active layer 54 is positioned between an anode 52 and a cathode 56. One of the electrodes can be disposed adjacent to one of an optional substrate. For example, the anode 52 can be positioned adjacent to a substrate 50. At least one of the electrodes is transparent or semi-transparent. If the transparent or semi-transparent electrode is adjacent to a substrate, the substrate is typically transparent or semi-transparent as well. The substrate 50, anode 52, and cathode 56 can be the same as those described above for an organic luminescent device. Either electrode or substrate can include multiple layers of material. For example, an anode can include a first layer of ITO and a second layer of a conductive polymer such as poly(3,4-ethylenedioxythiophene)-poly)styrene sulfonate).

The active layer usually contains a semiconductor material. The acene-thiophene copolymer of Formula I can be in the active layer. In many embodiments, the active layer includes both an electron donor material and an electron acceptor. In such active layers, the acene-thiophene copolymer functions as an electron donor material. Exemplary electron acceptor materials include, for example, fullerene derivatives such as [6,6]-phenyl-$C_{61}$-buytric acid methyl ester (PCBM), [70]PCBM, single-wall carbon nanotubes (SWNTs), nanocrystal CdSe particles or tetrapods, poly(2,5,2',5'-tetrahexyloxy-7,8'-dicyano-di-p-phenylene vinylene) (CN-PPV), cyano-poly(2-methoxy-5-(2-ethyl-hexyloxy)-1,4-phenylvinylene (MEH-CN-PPV), poly(oxa-1,4-phenylene-(1-cyano-1,2-vinylene)-(2-methoxy-5-(3,7-dimethyloctyloxy)-1,4-phenylene)-1,2-(2-cyanovinylene)-1,4-phenylene) (PCNEPV), 3,4,9,10-perylenetetracarboxylic bis-benzimidazol (PTCBI), and poly(2,5-diheptyloxy-p-phenylene vinylene) (HO-PPV).

The foregoing describes the invention in terms of embodiments foreseen by the inventors for which an enabling description was available, notwithstanding that insubstantial modifications of the invention, not presently foreseen, may nonetheless represent equivalents thereto.

EXAMPLES

All reagents were purchased from commercial sources and used without further purification unless otherwise noted. Sodium carbonate was obtained from Sigma Aldrich (Milwaukee, Wis.). ALIQUAT 336, a phase transfer catalyst, was obtained from Alfa Aesar (Ward Hill, Mass.). Tetrakis(triphenylphosphine)palladium(0) was obtained from Sigma Aldrich (Milwaukee, Wis.). Poly(5-(2-ethylhexyloxy)-2-methoxy-cyanoterphthalylidene) (MEH-CN-PPV) was obtained from Sigma Aldrich (Milwaukee, Wis.). HMDS (1,1,1,3,3,3-hexamethyldisilazane) and chlorobenzene were obtained from Alfa Aesar (Ward Hill, Mass.). Poly(3,4-ethylendioxythiophene)-poly(styrenesulfonate) formulation (1.3% solution in water) was obtained from Sigma Aldrich (Milwaukee, Wis.). [6,6]-phenyl-$C_{61}$-butyric acid methyl ester (PCBM), which was obtained from Nano-C (Westwood, Mass.). Sorbitol was obtained from Avocado Research Chemical Ltd. (Lancashire, England). The solvent (SOL-IJ-G-S1) was obtained from Cabot Corporation (Albuquerque, N. Mex.).

The surfactant TERGITOL TMN-6 was obtained from Dow Chemical (Midland, Mich.). Toluene was distilled from sodium. Heavily doped p-type silicon wafers (100) having 100 nanometer thermally grown oxide that were obtained from Silicon Valley Microelectronics, Inc. (Santa Clara, Calif.).

The following starting materials were prepared using published procedures as follows:

2,6-dibromoanthracene was prepared from commercially available 2,6diaminoanthraquinone (Sigma Aldrich) as described by Hodge et al, *Chem Comm.*, 73 (1997). The 2,6-dibromoanthracene was further purified by recrystallization from DMF.

2,6-di(4,4,5,5-tetramethyl-1,3,2-dioxaborolan-2-yl)anthracene was prepared from 2,6-dibromoanthracene according to the procedure published in the supporting information related to Meng et al., *J. Am. Chem. Soc.*, 127, 2406-2407 (2005).

2,5-dibromo-3,4-dihexylthiophene was prepared according to the procedure published in Vidal et al, *Chem. Eur. J.*, 6, 1663-1673 (2000).

Preparative Example 1

Preparation of poly(3,4-dihexylthiophene-alt-2,6-anthracene) (1)

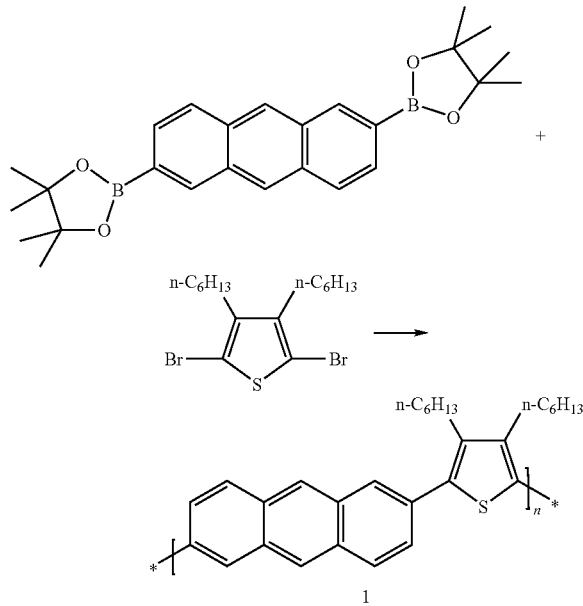

A 250 mL Schlenk flask was charged with 2,6-di(4,4,5,5-tetramethyl-1,3,2-dioxaborolan-2-yl)anthracene (2.631 g, 6.12 mmol), 2,5-dibromo-3,4-dihexylthiophene (2.544 g, 6.20 mmol), sodium carbonate (3.18 g, 30.0 mmol), ALIQUAT 336 (1.20 g), distilled water (15 mL), and toluene (100 mL). The mixture was degassed three times under a Schlenk line to remove oxygen. Tetrakis(triphenylphosphine)palladium(0) (0.150 g, 0.13 mmol) was then added under $N_2$ flow. After the mixture was degassed one more time, it was stirred under $N_2$ at 90° C. for 72 hours. A dark green precipitate appeared. The mixture was then cooled to 60° C. and the solid was removed by filtration. The toluene solution was separated from the filtrate and was washed with DI water until the water washes had a neutral pH. The toluene solution was then added dropwise to MeOH (500 mL) with vigorous stirring. A yellow precipitate appeared and was collected by filtration. The solid was re-dissolved in $CHCl_3$ (50 mL) and precipitated from MeOH (250 mL) twice and then washed with MeOH (via Soxhlet extraction) for 24 hours. A yellow solid (1.22 g, yield: 47%) was obtained as product. Mn=12000 g/mole. Mw=52000 g/mole. $^1$H NMR (400 MHz, $CDCl_3$): δ 8.20-8.53 ppm (br, 2H, ArH), 8.10-8.18 (br, 2H, ArH), 7.87-8.10 (br, 2H, ArH), 7.34-7.85 (br, 2H, ArH), 2.50-2.91 (br, 4H, $CH_2$), 1.49-1.84 (br, 4H, $CH_2$), 1.07-1.49 (br, 12H, $CH_2$), 0.67-0.97 (br, 6H, $CH_3$). TGA showed that the decomposition temperature was 455° C.

Example 1

Organic Thin Film Transistor

Preparation of HMDS-Treated Substrates

Silicon wafers were ultrasonically cleaned in iso-propanol for 30 minutes. After drying under a $N_2$ flow, the wafers were exposed to HDMS vapor under $N_2$ at room temperature in a closed container for 20 hours. The wafers were then stored under $N_2$ before film deposition.

Fabrication of Organic Thin Film Transistors

Poly(3,4-dihexylthiophene-alt-2,6-anthracene) in chlorobenzene solution (0.8 wt %) was either spin-coated (1000 revolutions per minute, 50 seconds) or knife coated on a silicon wafer or a HMDS-treated wafer. After air-drying, gold source/drain electrodes (60 nanometers thick) were patterned through a polymer shadow mask using a thermal evaporation method. A channel length (L) of 107 micrometers and a channel width (W) of 1000 micrometers were used.

Characterization of Organic Thin Film Transistors

Thin film transistors were characterized under ambient conditions using a Hewlett Packard Semiconductor Parameter Analyzer (Model 4145A, available from Hewlett Packard Corporation, Palo Alto, Calif.) by sweeping the gate voltage ($V_g$) from +10 V to −40 V, while remaining the drain voltage ($V_d$) at −40 V. A linear fit to the $I_d^{1/2}$-$V_g$ trace permitted the extraction of the saturation mobility and the threshold voltage (Vt). A linear fit to the $I_d$-$V_g$ trace allowed the subthreshold slope (S) and the current on/off ratio to be calculated.

Figure 9:
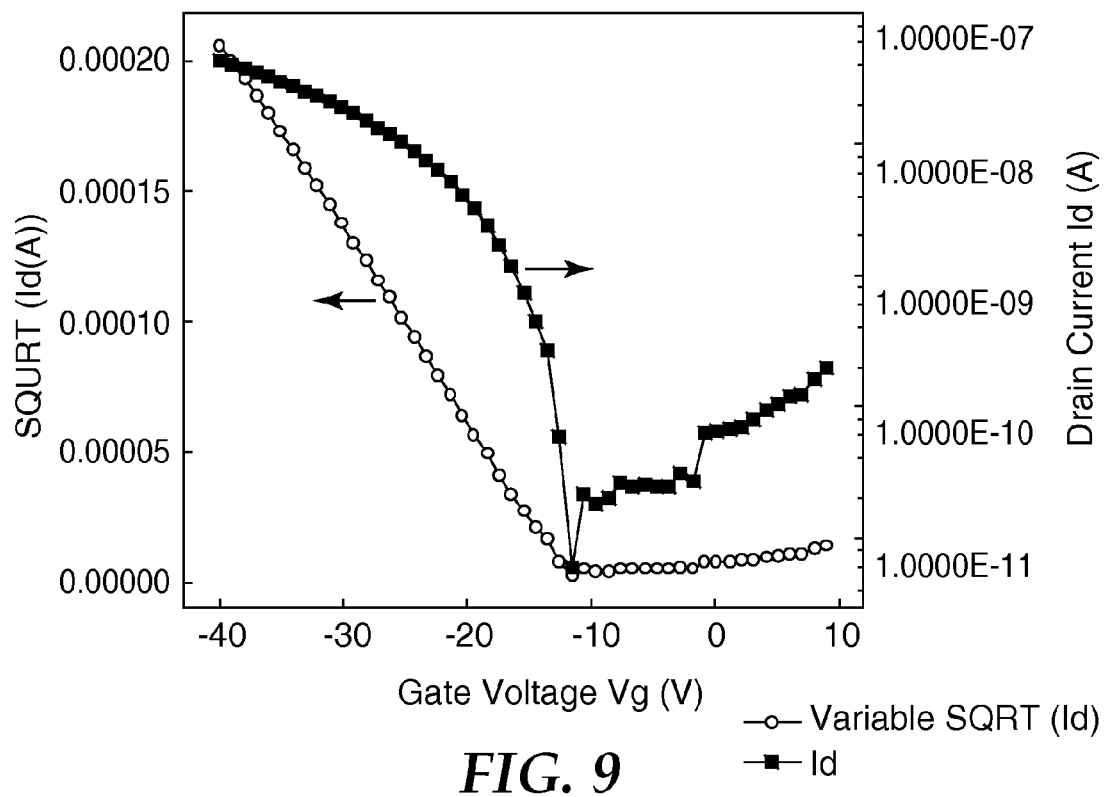
FIG. 9 shows the performance characteristics of one exemplary organic thin film transistor.

For spin-coated devices on substrates without any treatment, the charge transport mobility was in the range of $1\times10^{-5}$ to $5\times10^{-5}$ $cm^2$/V-sec. For knife coated devices fabricated on HMDS-treated substrates, the charge transport mobility was $3.5\times10^{-4}$ $cm^2$/V-sec and the on/off ratio was $7\times10^3$. FIG. 9 shows the device characteristics for an OTFT that was knife coated on the HMDS-treated substrate.

Examples 2A and 2B

Photovoltaic Cells

Fabrication of Thin Film Photovoltaic Cells

Two thin film photovoltaic cells were fabricated as follows: ITO/glass substrates with a resistance of 25 ohm/square were obtained from Thin Film Devices (Anaheim, Calif.) and were ultrasonically cleaned successively in a soap solution, deionized water, acetone, and then isopropanol. The clean substrates were dried in a nitrogen gas stream.

A conducting polymer coating solution was prepared as follow by mixing together one part of Solution I and two parts of Solution II. Solution I was prepared by adding sorbitol to 1.3 weight percent solution of poly(3,4-ethylendioxythiophene)-poly(styrenesulfonate) (PEDOT-PSS) in water. The concentration of sorbitol was 3 weight percent based on the weight of the solution. Solution II contained 32 weight percent water, 3.7 weight percent N-methyl-2-pyrrolidinone, 0.3 weight percent TERGITOL TMN-6, and 64 weight percent (SOL-IJ-G-SI) solvent, which is a mixture of ethylene glycol, glycerol, and ethanol. The conducting polymer coating solution was spin coated on top of the cleaned ITO/glass substrates at 1000 revolutions per minute for 50 seconds. The resulting sample was pre-baking at 100° C. for 2 minutes and curing at 165° C. for 15 minutes in nitrogen. The coating thickness was approximately 100 nanometers.

The active layers were coated from a mixture (50:50 by weight) of two components of organic semiconductor solutions, an electron donor and an electron acceptor, to form the so-called bulk heterojunction. For Example 2A, a solution was prepared that contained 1 weight percent of the electron donor semiconductor poly(3,4-dihexylthiophene-alt-2,6-anthracene) and 1 weight percent of the electron acceptor semiconductor poly(5-(2-ethylhexyloxy)-2-methoxy-cyanoterphthalylidene) (MEH-CN-PPV) dissolved in chlorobenzene. For Example 2B, a solution was prepared that contained 1.6 weight percent of the electron donor semiconductor poly(3,4-dihexylthiophene-alt-2,6-anthracene) and 1.6 weight percent of the electron acceptor semiconductor [6,6]-phenyl-$C_{61}$-butyric acid methyl ester (PCBM) dissolved in chlorobenzene. Each solution (electron donor solution and electron acceptor solution for sample 2A or electron donor solution and electron acceptor solution for sample 2B) was magnetically stirred overnight. The well-mixed solution blends were then spin-coated on top of separate PEDOT/PSS coated ITO/glass substrates at a spin speed of 800 revolutions per minute for 50 seconds. The samples were then baked on a hot plate at a temperature of 120° C. (Example 2A) or 110° C. (Example 2B) for 5 minutes to get a thickness of about 85 nanometers (Example 2A) or 220 nanometers (Example 2B). Finally, the samples were loaded in a vacuum chamber covered by a shadow mask with 2 millimeter diameter circular hole arrays. Calcium (20 nanometers) and then aluminum (80 nanometers) were evaporated onto the active layer to form 2 millimeter diameter circular cathode arrays. The ITO was the anode.

Device Performance Characteristics

Photocurrent measurements were made using a Keithley multimeter model 197A (Cleveland, Ohio). The light source was a 3M 9200 overhead projector. The power density of the 3M 9200 projector lamp was about 40 to 60 mW/cm$^2$. The photovoltaic cell was exposed from a distance of about 2 cm from the projector lamp. The resistance between the anode and cathode was first measured to make sure that no shorting occurred. A resistance of about 1 to 10 mega ohms (10$^6$ ohms) was measured for Example 2A and greater than 1,000 mega ohms was measured for Example 2B. When exposed to the projector lamp, the photocurrent density for Example 2A was 1.3 µA/cm$^2$ and the photocurrent density for Example 2B was 4.2 µA/cm$^2$.

We claim:

1. An electronic device comprising a copolymer of Formula I

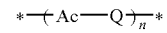

wherein
Ac is a radical of an acene having 3 to 5 fused aromatic rings, wherein Ac is unsubstituted or substituted with a substituent selected from an alkyl, alkoxy, thioalkyl, aryl, aralkyl, halo, haloalkyl, hydroxyalkyl, heteroalkyl, alkenyl, or a combination thereof;
Q is a divalent group of Formula II

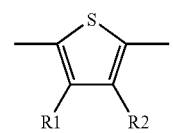

R1 and R2 are independently selected from hydrogen, alkyl, alkoxy, thioalkyl, aryl, aralkyl, halo, haloalkyl, hydroxyalkyl, heteroalkyl, alkenyl, or combinations thereof;
at least one of R1, R2, or the substituent of Ac has at least 4 carbon atoms; and
n is an integer equal to at least 4.

2. The electronic device of claim 1, wherein Ac is selected from anthracene-2,6-diyl, anthracene-2,7-diyl, anthracene-9,10-diyl, pentacene-2,9-diyl, pentacene-2,10-diyl, or pentacene-6,13-diyl, the Ac being unsubstituted or substituted with an alkyl, alkoxy, thioalkyl, aryl, aralkyl, halo, haloalkyl, hydroxyalkyl, heteroalkyl, alkenyl, or a combination thereof.

3. The electronic device of claim 1, wherein Ac is anthracene-2,6-diyl that is optionally substituted with an alkyl, alkoxy, thioalkyl, aryl, aralkyl, halo, haloalkyl, hydroxyalkyl, heteroalkyl, alkenyl, or a combination thereof.

4. The electronic device of claim 1, wherein the copolymer of Formula I is present in a semiconductor layer.

5. The electronic device of claim 4, wherein the electronic device comprises an organic thin film transistor.

6. The electronic device of claim 1, wherein the copolymer of Formula I is present in layer between a first electrode and a second electrode.

7. The electronic device of claim 6, wherein the electronic device is a photovoltaic cell.

8. The electronic device of claim 6, wherein electronic device comprises an organic luminescent device and the copolymer of Formula I is present in a hole transport layer within the organic luminescent device.

9. The electronic device of claim 6, wherein the electronic device comprises an organic luminescent device and the copolymer of Formula I is present in a light emitting layer within the organic luminescent device.

10. A method of preparing an electronic device, the method comprising providing a copolymeric layer comprising a copolymer of Formula I

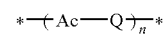

wherein
Ac is a radical of an acene having 3 to 5 fused aromatic rings, wherein Ac is unsubstituted or substituted with a substituent selected from an alkyl, alkoxy, thioalkyl, aryl, aralkyl, halo, haloalkyl, hydroxyalkyl, heteroalkyl, alkenyl, or a combination thereof;
Q is a divalent group of Formula II

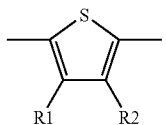

R1 and R2 are independently selected from hydrogen, alkyl, alkoxy, thioalkyl, aryl, aralkyl, halo, haloalkyl, hydroxyalkyl, heteroalkyl, alkenyl, or combinations thereof;
at least one of R1, R2, or the substituent of Ac has at least 4 carbon atoms; and
n is an integer equal to at least 4.

11. The method of claim 10, wherein providing the copolymeric layer comprises
preparing a coating solution comprising the copolymer and a solvent, wherein the copolymer is present in an amount of at least 0.05 weight percent based on the weight of the coating solution;
forming a solution layer from the coating solution; and
removing at least some of the solvent from the solution layer.

12. The method of claim 10, further comprising providing a first layer adjacent to the copolymeric layer, the first layer comprising a conducting layer or a dielectric layer.

13. The method of claim 10, wherein electronic device is an organic thin film transistor and the method further comprises arranging multiple layers in the following order:
a gate electrode;
a gate dielectric layer;
a semiconductor layer comprising a comprising the copolymeric layer; and
a layer comprising a source electrode and a drain electrode, wherein the source electrode and the drain electrode are separated from each other and wherein the semiconductor layer contacts both the drain electrode and the source electrode.

14. The method of claim 10, wherein electronic device is an organic thin film transistor and the method further comprises arranging multiple layers in the following order:
a gate electrode;
a gate dielectric layer;
a layer comprising a source electrode and a drain electrode, wherein the source electrode and the drain electrode are separated from each other;
a semiconductor layer in contact with both the source electrode and the drain electrode, the semiconductor layer comprising the copolymeric layer.

15. The method of claim 10, further comprising positioning the copolymeric layer between a first electrode and a second electrode.

16. The method of claim 10, wherein the electronic device comprises a photovoltaic cell and the method further comprises positioning the copolymeric layer between an anode and a cathode.

17. The method of claim 10, wherein electronic device comprises an organic luminescent device and the method further comprises positioning the copolymeric layer between an anode and a cathode.

18. The method of claim 17, wherein the organic luminescent device comprises a hole transport layer comprising the copolymeric layer.

19. The method of claim 17, wherein the organic luminescent device comprises a luminescent layer comprising the copolymeric layer.

20. The method of claim 10, wherein Ac is selected from anthracene-2,6-diyl, anthracene-2,7-diyl, anthracene-9,10-diyl, pentacene-2,9-diyl, pentacene-2,10-diyl, or pentacene-6,13-diyl, the Ac being optionally substituted with an alkyl, alkoxy, thioalkyl, aryl, aralkyl, halo, haloalkyl, hydroxyalkyl, heteroalkyl, alkenyl, or a combination thereof.

21. A copolymer of Formula I

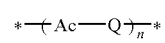

wherein
Ac is a radical of an acene having 3 to 5 fused aromatic rings, wherein Ac is unsubstituted or substituted with a substituent selected from an alkyl, alkoxy, thioalkyl, aryl, aralkyl, halo, haloalkyl, hydroxyalkyl, heteroalkyl, alkenyl, or combinations thereof
Q is a divalent group of Formula II;

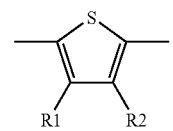

R1 and R2 are each independently selected from hydrogen, alkyl, alkoxy, thioalkyl, aryl, aralkyl, halo, haloalkyl, hydroxyalkyl, heteroalkyl, or alkenyl; and
n is an integer greater than or equal to 4.

22. The copolymer of claim 21, wherein Ac is selected from anthracene-2,6-diyl, anthracene-2,7-diyl, anthracene-9,10-diyl, tetracene-2,8-diyl, tetracene-2-9-diyl, pentacene-2,9-diyl, pentacene-2,10diyl, or pentacene-6,13-diyl, the Ac being unsubstituted or substituted with a substituent selected from an alkyl, alkoxy, thioalkyl, aryl, aralkyl, halo, haloalkyl, hydroxyalkyl, heteroalkyl, alkenyl, or combinations thereof.

23. The copolymer of claim 21, wherein Ac is anthracene-2,6-diyl that is unsubstituted or substituted with a substituent selected from an alkyl, alkoxy, thioalkyl, aryl, aralkyl, halo, haloalkyl, hydroxyalkyl, heteroalkyl, alkenyl, or combinations thereof.

24. The copolymer of claim 21, wherein a least one of the R1 group, R2 group, or the Ac substituent has at least 4 carbon atoms.

25. The copolymer of claim 21, wherein at least one of R1 or R2 is an alkyl having at least 4 carbon atoms, an alkoxy having at least 4 carbon atoms, a thioalkyl having at least 4 carbon atoms, an aryl having at least 6 carbon atoms, an aralkyl having at least 10 carbon atoms, a haloalkyl having at least 4 carbon atoms, a hydroxyalkyl having at least 4 carbon atoms, a heteroalkyl having at least 4 carbon atoms, an alkenyl having at least 4 carbon atoms, or a combination thereof.

26. The copolymer of claim 21, wherein both R1 and R2 are independently selected from alkyl having at least 4 carbon atoms, an alkoxy having at least 4 carbon atoms, a thioalkyl having at least 4 carbon atoms, an aryl having at least 6 carbon atoms, an aralkyl having at least 10 carbon atoms, a haloalkyl having at least 4 carbon atoms, a hydroxyalkyl having at least 4 carbon atoms, a heteroalkyl having at least 4 carbon atoms, an alkenyl having at least 4 carbon atoms, or a combination thereof.

27. The copolymer of claim 21, wherein both R1 and R2 are independently an alkyl having at least 4 carbon atoms.

28. A composition comprising a solvent and a compound of Formula I

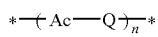

I wherein
  Ac is a radical of an acene having 3 to 5 fused aromatic rings, the acene being unsubstituted or substituted with a substituent selected from an alkyl, alkoxy, thioalkyl, aryl, aralkyl, halo, haloalkyl, hydroxyalkyl, heteroalkyl, alkenyl, or a combination thereof
  Q is a divalent group selected from a group of Formula II;

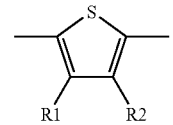

II

R1 and R2 are each independently selected from hydrogen, alkyl, alkoxy, thioalkyl, aryl, aralkyl, halo, haloalkyl, hydroxyalkyl, heteroalkyl, or alkenyl; and
  n is an integer greater than or equal to 4.

29. The composition of claim 28, wherein the composition is a solution comprising at least 0.05 weight percent of the compound of Formula I based on the weight of the solution.

* * * * *

UNITED STATES PATENT AND TRADEMARK OFFICE
CERTIFICATE OF CORRECTION

PATENT NO. : 7,667,230 B2  
APPLICATION NO. : 11/278229  
DATED : February 23, 2010  
INVENTOR(S) : Zhu et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 999 days.

Signed and Sealed this

Seventh Day of December, 2010

David J. Kappos  
*Director of the United States Patent and Trademark Office*

UNITED STATES PATENT AND TRADEMARK OFFICE
CERTIFICATE OF CORRECTION

| | | |
|---|---|---|
| PATENT NO. | : 7,667,230 B2 | Page 1 of 3 |
| APPLICATION NO. | : 11/278229 | |
| DATED | : February 23, 2010 | |
| INVENTOR(S) | : Peiwang Zhu | |

It is certified that error appears in the above-identified patent and that said Letters Patent is hereby corrected as shown below:

On the Title Pg,
Page 2, Item (56) (Other Publications)
Line 1, delete "Binaphthy1" and insert -- Binaphthyl --, therefor.

Line 10, delete "Soluable" and insert -- Soluble --, therefor.

Page 2, Item (56) (Other Publications)
Line 38, delete "Angewante" and insert -- Angewandte --, therefor.

Line 43, delete ""Fluoronated" and insert -- "Fluorinated --, therefor.

Page 3, Item (56) (Other Publications)
Line 2, delete "filed" and insert -- filed on --, therefor.

Line 4, delete "filed" and insert -- filed on --, therefor.

Line 5, after "filed" insert -- on --.

Line 10, delete "Silethynly" and insert -- Silylethynyl --, therefor.

Line 12, delete ""Electrtonic" and insert -- "Electronic --, therefor.

Line 13, delete "Silethynly" and insert -- Silylethynyl --, therefor.

Column 2
Line 4, delete "thereof" and insert -- thereof. --, therefor.

Column 4
Line 37 (Approx.), delete "thereof" and insert -- thereof. --, therefor.

Signed and Sealed this
Thirtieth Day of August, 2011

David J. Kappos
*Director of the United States Patent and Trademark Office*

Column 6
Line 3, delete "thereof" and insert -- thereof. --, therefor.

Column 7
Line 47, delete "cis-9hexadecenyl," and insert -- cis-9-hexadecenyl, --, therefor.

Line 51, delete "2-methy-" and insert -- 2-methyl- --, therefor.

Column 8
Line 61, delete "dibromonapthalene," and insert -- dibromonaphthalene, --, therefor.

Line 61-62, delete "dibromonapthalene," and insert -- dibromonaphthalene, --, therefor.

Column 10
Line 1-10 (Approx.), delete " 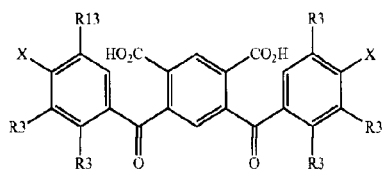 " and insert -- 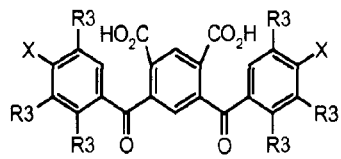 --, therefor.

Column 13
Line 47, delete "thereof" and insert -- thereof. --, therefor.

Column 16
Line 3, delete "exiton" and insert -- exciton --, therefor.

Column 17
Line 44, delete "co-polymers" and insert -- copolymers --, therefor.

Column 18
Line 16, delete "(cyclometallated" and insert -- (cyclometalated --, therefor.

Line 40, delete "polyarylates," and insert -- polyacrylates, --, therefor.

Column 19
Line 2, delete "4,4",44"-tris(N-3-" and insert -- 4,4',4"-tris(N-3- --, therefor.

Line 4, delete "(carbozole" and insert -- (carbazole --, therefor.

Line 8-9, delete "tetafluoro-tetracynaoquinodimethan," and insert
-- tetrafluoro-tetracynaoquinodimethane, --, therefor.

Line 11, delete "dioxyide" and insert -- dioxide --, therefor.

Line 59, delete "phenanthraline" and insert -- phenanthroline --, therefor.

Column 20
Line 60-61, delete "ethylendioxythiophene)" and insert -- ethylenedioxythiophene) --, therefor.

Column 21
Line 10, delete "2,6diaminoanthraquinone" and insert -- 2,6-diaminoanthraquinone --, therefor.

Column 23
Line 4-5 (Approx.), delete "ethylendioxythiophene)" and insert -- ethylenedioxythiophene) --, therefor.

Column 25
Line 42, in Claim 13, after "layer" delete "comprising a".

Column 26
Line 29 (Approx.), in Claim 21, after "thereof" insert -- ; --.

Line 47, in Claim 22, delete "2-9" and insert -- 2,9 --, therefor.

Line 48, in Claim 22, delete "10diyl," and insert -- 10-diyl, --, therefor.

Line 57, in Claim 24, delete "a" and insert -- at --, therefor.

Column 28
Line 3, in Claim 28, after "thereof" insert -- ; --.